(12) United States Patent
Watanabe et al.

(10) Patent No.: US 12,417,732 B2
(45) Date of Patent: Sep. 16, 2025

(54) DISPLAY APPARATUS AND ELECTRONIC EQUIPMENT

(71) Applicant: SONY GROUP CORPORATION, Tokyo (JP)

(72) Inventors: Toshihiko Watanabe, Tokyo (JP); Koichi Nagasawa, Tokyo (JP); Shinichiro Tajiri, Tokyo (JP); Tetsuo Minami, Tokyo (JP); Kei Kimura, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 0 days.

(21) Appl. No.: 18/716,110

(22) PCT Filed: Nov. 15, 2022

(86) PCT No.: PCT/JP2022/042406
§ 371 (c)(1),
(2) Date: Jun. 3, 2024

(87) PCT Pub. No.: WO2023/106049
PCT Pub. Date: Jun. 15, 2023

(65) Prior Publication Data
US 2025/0037645 A1    Jan. 30, 2025

(30) Foreign Application Priority Data
Dec. 10, 2021 (JP) .................. 2021-201182

(51) Int. Cl.
*G09G 3/32* (2016.01)
*H01L 25/075* (2006.01)
(Continued)

(52) U.S. Cl.
CPC ........... *G09G 3/32* (2013.01); *H01L 25/0753* (2013.01); *H01L 25/167* (2013.01);
(Continued)

(58) Field of Classification Search
CPC ............ G09G 3/32; G09G 2300/0452; G09G 2320/0247; G09G 2320/0673;
(Continued)

(56) References Cited

U.S. PATENT DOCUMENTS

2011/0037791 A1* 2/2011 Haas ............... G09G 3/325
345/690
2011/0254759 A1* 10/2011 Mori ............... G09G 3/3614
345/88

(Continued)

FOREIGN PATENT DOCUMENTS

JP    2006-163067 A    6/2006
JP    2007-149640 A    6/2007
(Continued)

OTHER PUBLICATIONS

Susumu et al., JP 2009216852 A machine translation, published Sep. 4, 2009 (Year: 2009).*
(Continued)

*Primary Examiner* — Peter D McLoone
(74) *Attorney, Agent, or Firm* — CHIP LAW GROUP

(57) ABSTRACT

Provided is a display apparatus that can suppress degradation of image quality caused by possible color drift. A display apparatus includes a board including a driving circuit based on a current amplitude modulation scheme, multiple first light emitting elements and multiple second light emitting elements two-dimensionally arranged on the board, and a wavelength correcting layer that is able to correct wavelengths of light emitted from the multiple first light emitting elements. The driving circuit is able to independently gamma-correct a first signal fed to the first light emitting element and a second signal fed to the second light emitting element.

20 Claims, 19 Drawing Sheets

(51) Int. Cl.
  *H01L 25/16* (2023.01)
  *H10H 20/825* (2025.01)
  *H10H 20/851* (2025.01)

(52) U.S. Cl.
  CPC ........ *H10H 20/825* (2025.01); *H10H 20/851* (2025.01); *G09G 2300/0452* (2013.01); *G09G 2320/0247* (2013.01); *G09G 2320/0673* (2013.01)

(58) Field of Classification Search
  CPC ............... H10H 20/851; H10H 20/825; H01L 25/0753; H01L 25/167
  See application file for complete search history.

(56) References Cited

U.S. PATENT DOCUMENTS

| | | |
|---|---|---|
| 2017/0213496 A1 | 7/2017 | Hsu |
| 2022/0358876 A1* | 11/2022 | Akimoto ............. G09G 3/3233 |

FOREIGN PATENT DOCUMENTS

| | | |
|---|---|---|
| JP | 2009-216852 A | 9/2009 |
| JP | 2011-141412 A | 7/2011 |
| JP | 2011-523467 A | 8/2011 |
| JP | 2018-025759 A | 2/2018 |
| JP | 2021-026013 A | 2/2021 |
| JP | 2021-033107 A | 3/2021 |
| WO | 2020/027107 A1 | 2/2020 |
| WO | 2020/042522 A1 | 3/2020 |

OTHER PUBLICATIONS

International Search Report and Written Opinion of PCT Application No. PCT/JP2022/042406, issued on Feb. 7, 2023, 11 pages of ISRWO.

* cited by examiner

DISPLAY APPARATUS AND ELECTRONIC EQUIPMENT

CROSS REFERENCE TO RELATED APPLICATIONS

This application is a U.S. National Phase of International Patent Application No. PCT/JP2022/042406 filed on Nov. 15, 2022, which claims priority benefit of Japanese Patent Application No. JP 2021-201182 filed in the Japan Patent Office on Dec. 10, 2021. Each of the above-referenced applications is hereby incorporated herein by reference in its entirety.

TECHNICAL FIELD

The present disclosure relates to a display apparatus and electronic equipment including the display apparatus.

BACKGROUND ART

Display apparatuses (for example, LED (Light Emitting Diode) display apparatuses) commonly use pulse width modulated drive (see, for example, PTL 1). However, problems with a display apparatus using pulse width modulated drive are such that the display apparatus includes a complicated circuit, has difficulty in achieving higher pixel definition, and is susceptible to flickering due to short pulses during low luminance, leading to degraded image quality.

CITATION LIST

Patent Literature

[PTL 1]
Japanese Patent Laid-open No. 2021-26013

SUMMARY

Technical Problem

The above-described problems can be solved by using a current amplitude modulation scheme as a driving scheme for the display apparatus. However, a light emitting element is subjected to an emission wavelength shift caused by a change in current density of the light emitting element, leading to a possible color drift in the light emitting element and thus degrading image quality.

An object of the present disclosure is to provide a display apparatus that can suppress degradation of image quality caused by a possible color drift and electronic equipment including the display apparatus.

Solution to Problem

To solve the problem, a display apparatus according to the present disclosure includes a board including a driving circuit based on a current amplitude modulation scheme, multiple first light emitting elements and multiple second light emitting elements two-dimensionally arranged on the board, and a wavelength correcting layer that is able to correct wavelengths of light emitted from the multiple first light emitting elements.

The driving circuit is able to independently gamma-correct a first signal fed to each of the first light emitting elements and a second signal fed to each of the second light emitting elements.

A display apparatus according to the present disclosure includes a board including a driving circuit based on a current amplitude modulated drive scheme, and multiple first light emitting elements and multiple second light emitting elements two-dimensionally arranged on the board.

Each of the first light emitting elements has a resonator structure that is able to correct light emitted from the first light emitting element.

The driving circuit is able to independently gamma-correct a first signal fed to the first light emitting element and a second signal fed to the second light emitting element.

Electronic equipment according to the present disclosure includes a display apparatus according to the present disclosure.

In the present disclosure, the wavelength correcting layer may include at least one type selected from a group including a color filter, a bandpass filter, a wavelength cut filter, and a color converting layer.

In the present disclosure, the wavelength correcting layer includes multiple wavelength correcting sections, and each of the wavelength correcting sections may be provided on or above a corresponding one of the first light emitting elements. The wavelength correcting section may include at least one type selected from the group including a color filter section, a bandpass filter section, a wavelength cut filter section, and a color converting section.

In the present disclosure, the wavelength correcting layer may include a light blocking section around or on the wavelength correcting section.

In the present disclosure, the wavelength correcting layer may include multiple openings, and each of the openings may be provided on or above a corresponding one of the second light emitting elements.

In the present disclosure, the multiple first light emitting elements may each include a first compound semiconductor light emitting element that is able to emit red light, and the multiple second light emitting elements may each include a second compound semiconductor light emitting element that is able to emit green light and a third compound semiconductor light emitting element that is able to emit blue light.

In the present disclosure, the multiple first light emitting elements may each include a first compound semiconductor light emitting element that is able to emit green light, and the multiple second light emitting elements may each include a second compound semiconductor light emitting element that is able to emit red light and a third compound semiconductor light emitting element that is able to emit blue light.

In the present disclosure, the multiple first light emitting elements may each include a first compound semiconductor light emitting element that is able to emit blue light, and the multiple second light emitting elements may each include a second compound semiconductor light emitting element that is able to emit red light and a third compound semiconductor light emitting element that is able to emit green light.

In the present disclosure, the multiple first light emitting elements may each include a first compound semiconductor light emitting element that is able to emit red light and a second compound semiconductor light emitting element that is able to emit green light, and the multiple second light emitting elements may each include a third compound semiconductor light emitting element that is able to emit blue light.

In the present disclosure, the multiple first light emitting elements may each include a first compound semiconductor light emitting element that is able to emit red light and a second compound semiconductor light emitting element that is able to emit blue light, and the multiple second light emitting elements may each include a third compound semiconductor light emitting element that is able to emit green light.

In the present disclosure, the multiple first light emitting elements may each include a first compound semiconductor light emitting element that is able to emit green light and a second compound semiconductor light emitting element that is able to emit blue light, and the multiple second light emitting elements may each include a third compound semiconductor light emitting element that is able to emit red light.

BRIEF DESCRIPTION OF DRAWINGS

FIG. 11A is a cross-sectional view taken along line XIA-XIA in FIG. 10. FIG. 11B is a cross-sectional view taken along line XIB-XIB in FIG. 10.

FIG. 24A is a front view illustrating an example of appearance of a digital still camera. FIG. 24B is a rear view illustrating an example of appearance of the digital still camera.

DESCRIPTION OF EMBODIMENT

An embodiment of the present disclosure will be described in the following order. Note that, in all the drawings of the embodiment, the identical or corresponding portions are denoted by identical reference signs.

1 Embodiment (Example of Display Apparatus)
2 Variations (Variations of Display Apparatus)
3 Applied Example (Example of Electronic Equipment)

1 Embodiment

[Configuration of Display Apparatus 10]

Figure 1:
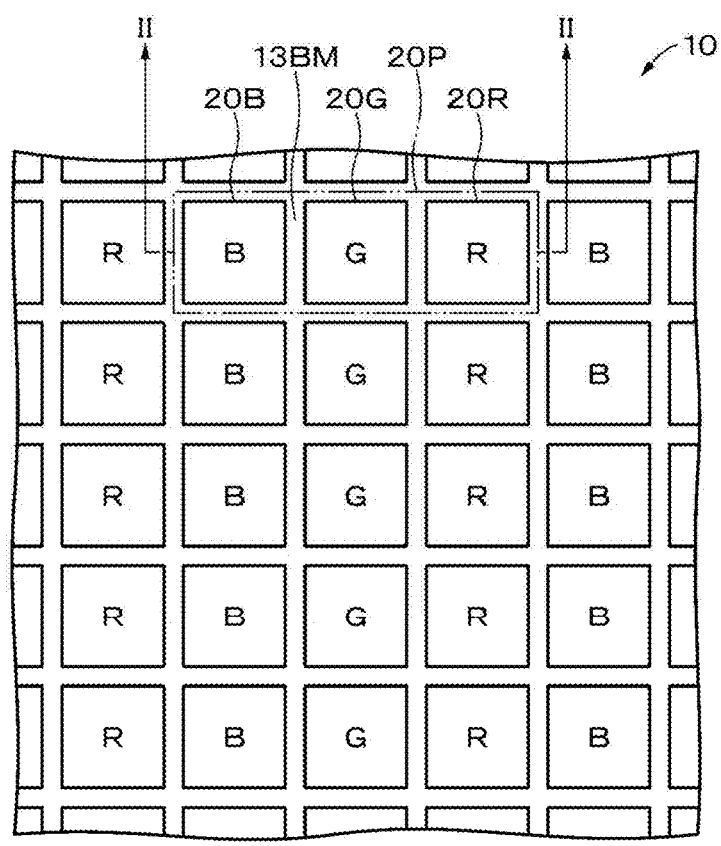
FIG. 1 is a plan view illustrating an example of a configuration of a display apparatus according to an embodiment.
Figure 2:
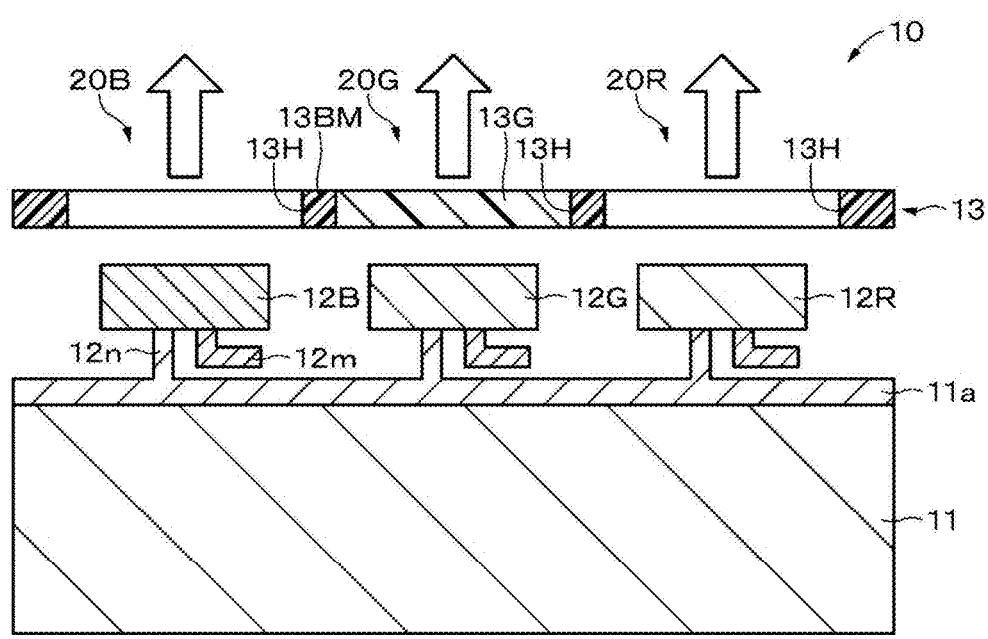
FIG. 2 is a cross-sectional view taken along line II-II in FIG. 1.

FIG. 1 is a plan view illustrating an example of a configuration of a display apparatus 10 according to an embodiment. FIG. 2 is a cross-sectional view taken along line II-II in FIG. 1. The display apparatus 10 includes a circuit board 11 and multiple pixels 20P. The display apparatus 100 is, for example, an LED display apparatus. The display apparatus 100 is an example of a light emitting device.

In the description below, for layers and members constituting the display apparatus 10, a surface corresponding to a display surface side of the display apparatus 10 is referred to as a first surface, whereas a surface opposite to the display surface is referred to as a second surface.

(Circuit Board 11)

The circuit board 11 is what is generally called a backplane. The circuit board 11 11 drives the multiple pixels 20P. The first surface of the circuit board 11 is provided with wiring 11a, a driving circuit 30 illustrated in FIG. 4, and the like.

A board main body of the circuit board 11 may include a semiconductor from which, for example, transistors can easily be formed, or glass or resin having low moisture and oxygen permeability. Specifically, the board main body may be a semiconductor board, a glass board, a resin board, or the like. The semiconductor board includes, for example, amorphous silicon, polycrystalline silicon, or the like. The glass board includes, for example, high strain point glass, soda glass, borosilicate glass, forsterite, lead glass, quartz glass, or the like. The resin board includes at least one type selected from the group including, for example, polymethylmethacrylate, polyvinyl alcohol, polyvinylphenol, polyether sulfone, polyimide, polycarbonate, polyethylene terephthalate, polyethylene naphthalate, and the like.
(Pixel 20P)

The multiple pixels 20P are two-dimensionally arranged on a first surface of the circuit board 11 in a defined arrangement pattern. The pixel 20P includes a red subpixel 20R, a green subpixel 20G, and a blue subpixel 20B. The red subpixel 20R is an example of a first subpixel. The green subpixel 20G and the blue subpixel 20B are examples of a second subpixel. A first electrode of each of the red subpixel 20R, the green subpixel 20G, and the blue subpixel 20B is connected to the wiring (not illustrated) on the circuit board 11 by a connection member 12m such as a bump or a via. A second electrode of each of the red subpixel 20R, the green subpixel 20G, and the blue subpixel 20B is connected to the wiring 11a on the circuit board 11 by a connection member 12n such as a bump or a via.

The multiple pixels 20P include multiple compound semiconductor light emitting elements 12R (hereinafter referred to as the "light emitting elements 12R"), multiple compound semiconductor light emitting elements 12G (hereinafter referred to as the "light emitting elements 12G"), multiple compound semiconductor light emitting elements 12B (hereinafter referred to as the "light emitting elements 12B"), and a color filter 13. Specifically, the green subpixel 20G includes the light emitting element 12G and the color filter 13. The red subpixel 20R includes the light emitting element 12R. The blue subpixel 20B includes the light emitting element 12B.

Note that, in the description below, in a case where the red subpixel 20R, the green subpixel 20G, and the blue subpixel 20B are not particularly distinguished from one another, the subpixels are collectively referred to as subpixels 20. In a case where the light emitting elements 12R, 12G, and 12B are not particularly distinguished from one another, the light emitting elements are collectively referred to as the light emitting elements 12. The light emitting element 12G is an example of the first compound semiconductor light emitting element, and the light emitting elements 12R and 12B are examples of the second compound semiconductor light emitting element. The multiple light emitting elements 12G are two-dimensionally arranged on the first surface of the circuit board 11 in a defined arrangement pattern such as a matrix or a delt form.
(Light Emitting Element 12G)

Figure 20:
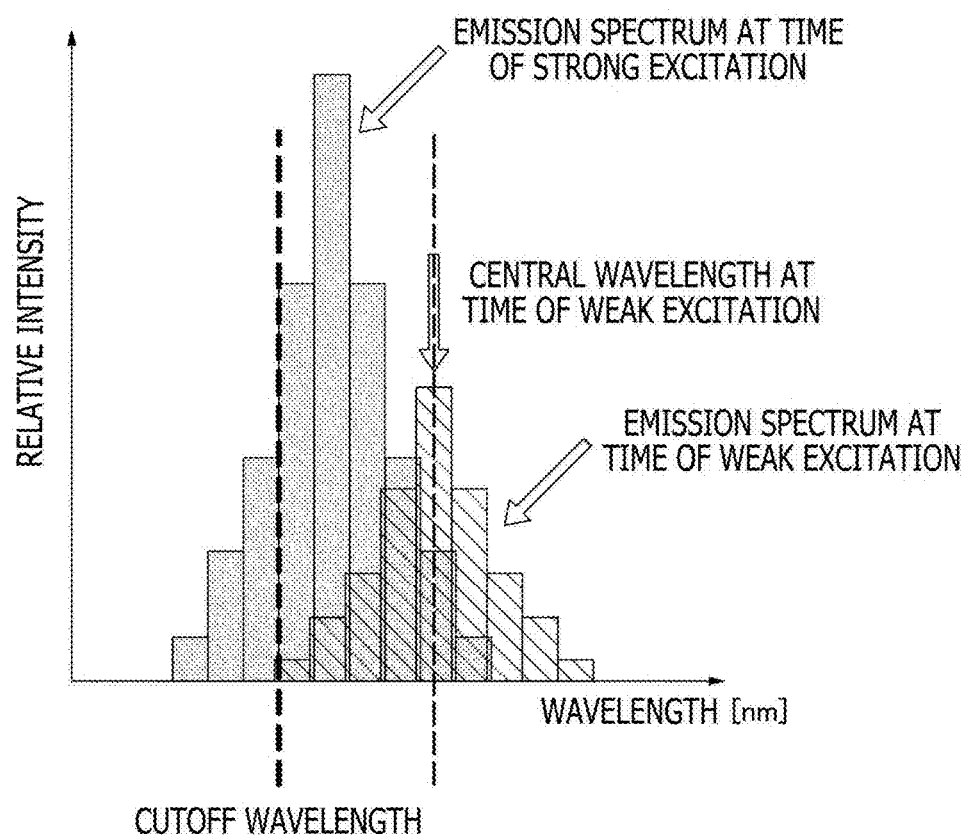
FIG. 20 is a diagram illustrating examples of emission spectra of a compound semiconductor light emitting element obtained at the time of weak excitation and at the time of strong excitation.

The light emitting element 12G can emit green light. The light emitting element 12G is configured to generate an emission wavelength shift in response to a change in current density of the light emitting element 12G. An emission spectrum of the light emitting element 12G may shift toward shorter wavelengths in response to an increase in current density, as illustrated in FIG. 20. For example, in a case where the light emitting element 12G is a GaN-based compound semiconductor light emitting element, the emission spectrum of the light emitting element 12G shifts toward shorter wavelengths in response to an increase in current density.

Figure 3:
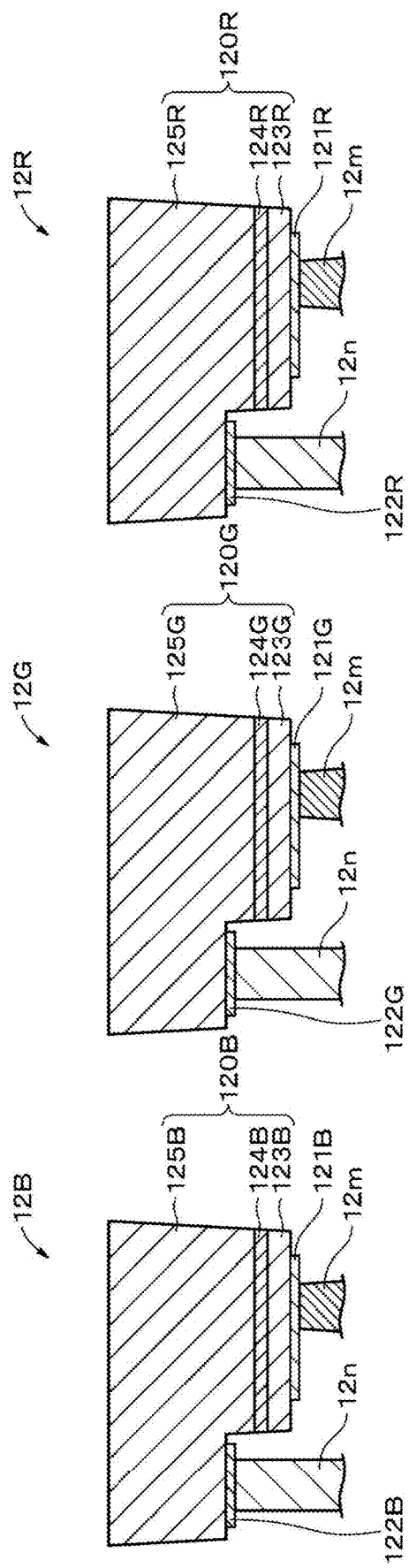
FIG. 3 is a cross-sectional view illustrating an example of a configuration of a compound semiconductor light emitting element.

The light emitting element 12G is, for example, a green LED element. As illustrated in FIG. 3, the light emitting element 12G includes a compound semiconductor laminate 120G, a first electrode 121G, and a second electrode 122G. The compound semiconductor laminate 120G includes a first compound semiconductor layer 123G, a light emitting layer 124G, and a second compound semiconductor layer 125G arranged in this order.

A second surface of the first compound semiconductor layer 123G faces the first surface of the circuit board 11. A part of a second surface of the second compound semiconductor layer 125G is an exposed portion that is exposed rather than being covered with the light emitting layer 124G and the first compound semiconductor layer 123G. The first electrode 121G is provided on the second surface of the first compound semiconductor layer 123G. The second electrode 122G is provided on the exposed portion of the second compound semiconductor layer 125G. The first electrode 121G is connected to the wiring (not illustrated) on the first surface of the circuit board 11 by the connection member 12m such as a bump or a via. The second electrode 122G is connected to the wiring 11a on the first surface of the circuit board 11 by the connection member 12n such as a bump or a via.

The light emitting layer 124G can emit green light. The first compound semiconductor layer 123, the light emitting layer 124G, and the second compound semiconductor layer 125G include a GaN-based compound semiconductor, for example, an InGaN-based compound semiconductor, an AlInGaN-based compound semiconductor, or the like. The first compound semiconductor layer 123 has a first conductivity type, and the second compound semiconductor layer 125G has a second conductivity type that is opposite to the first conductivity type. The first conductivity type may be a p type, whereas the second conductivity type may be an n type, or the first conductivity type may be the n type, whereas the second conductivity type may be the p type. The light emitting element 12G may be connected in a cathode common manner or an anode common manner.
(Light Emitting Element 12R)

The light emitting element 12R can emit red light. The light emitting element 12R is, for example, a red LED element. As illustrated in FIG. 3, the light emitting element 12R includes a compound semiconductor laminate 120R, a first electrode 121R, and a second electrode 122R. The compound semiconductor laminate 120R includes a first compound semiconductor layer 123R, a light emitting layer 124R, and a second compound semiconductor layer 125R arranged in this order.

The light emitting layer 124R can emit red light. The first compound semiconductor layer 123R, the light emitting layer 124R, and the second compound semiconductor layer 125R include, for example, an AlGaInP-based compound semiconductor, an AlGaInAs-based compound semiconductor, an AlGaAs-based compound semiconductor, a GaAsP-based compound semiconductor, a GaP-based compound semiconductor, or a perovskite semiconductor. The first compound semiconductor layer 123R has the first conductivity type, and the second compound semiconductor layer 125R has the second conductivity type that is opposite to the first conductivity type.

The red subpixel 20R is otherwise similar to the green subpixel 20G.
(Light Emitting Element 12B)

The light emitting element 12B can emit blue light. The light emitting element 12B is, for example, a blue LED element. As illustrated in FIG. 3, the light emitting element 12B includes a compound semiconductor laminate 120B, a first electrode 121B, and a second electrode 122B. The compound semiconductor laminate 120B includes a first compound semiconductor layer 123B, a light emitting layer 124B, and a second compound semiconductor layer 125B arranged in this order.

The light emitting layer 124B can emit blue light. The first compound semiconductor layer 123B, the light emitting layer 124B, and the second compound semiconductor layer 125B include, for example, an AlInGaN-based compound semiconductor, an InGaN-based compound semiconductor, a GaN-based compound semiconductor, an AlGaN-based compound semiconductor, a ZnSe-based compound semiconductor, a ZnO-based compound semiconductor, or a perovskite semiconductor. The first compound semiconductor layer 123B has the first conductivity type, and the second compound semiconductor layer 125B has the second conductivity type that is opposite to the first conductivity type.

The blue subpixel 20B is otherwise similar to the green subpixel 20G.

(Color Filter 13)

The color filter 13 is an example of a wavelength correcting layer. The color filter 13 includes a light blocking section 13BM and multiple green filter sections 13G.

The light blocking section 13BM is a layer including multiple openings 13H. The openings 13H penetrate the display apparatus 10 in a thickness direction. Each opening 13H is provided above the light emitting element 12. That is, in a plan view, the light blocking section 13BM is provided in a portion between the adjacent light emitting elements 12. In a plan view, the light blocking section 13BM is provided around the green filter section 13G in a manner surrounding the green filter section 13G. In the specification, the plan view means a manner of viewing used when an object is viewed from a direction perpendicular to a display surface of the display apparatus 10.

The light blocking section 13BM is black. The light blocking section 13BM can block light emitted from the light emitting element 12. The light blocking section 13BM may be a black matrix. The light blocking section 13BM includes, for example, a black resist.

The green filter section 13G is an example of a wavelength correcting section. The green filter section 13G is provided in the opening 13H above the light emitting element 12G. The green filter section 13G can correct an emission wavelength shift caused by a change in the current density of the light emitting element 12G. Specifically, for example, the green filter section 13G allows green light of light emitted from the light emitting element 12G to transmit therethrough, while blocking light other than the green light. The green filter section 13G may have spectroscopic characteristics in which the half-value width (full width at half height) of a peak ranges from 490 to 550 nm inclusive. The peak wavelength of the light emitting element 12G at the time of weak excitation (see FIG. 20) is preferably closer to the central wavelength of the green filter section 13G than the peak wavelength of the light emitting element 12G at the time of strong excitation (see FIG. 20). This enables suppression of a decrease in luminance caused by the green filter section 13G.

The opening 13H above the light emitting element 12R may be a cavity or may be filled with resin that is transparent to red light emitted from the light emitting element 12R. The opening 13H above the light emitting element 12B may be a cavity or may be filled with resin that is transparent to blue light emitted from the light emitting element 12B.

[Configuration of Driving Circuit 30]

Figure 4:
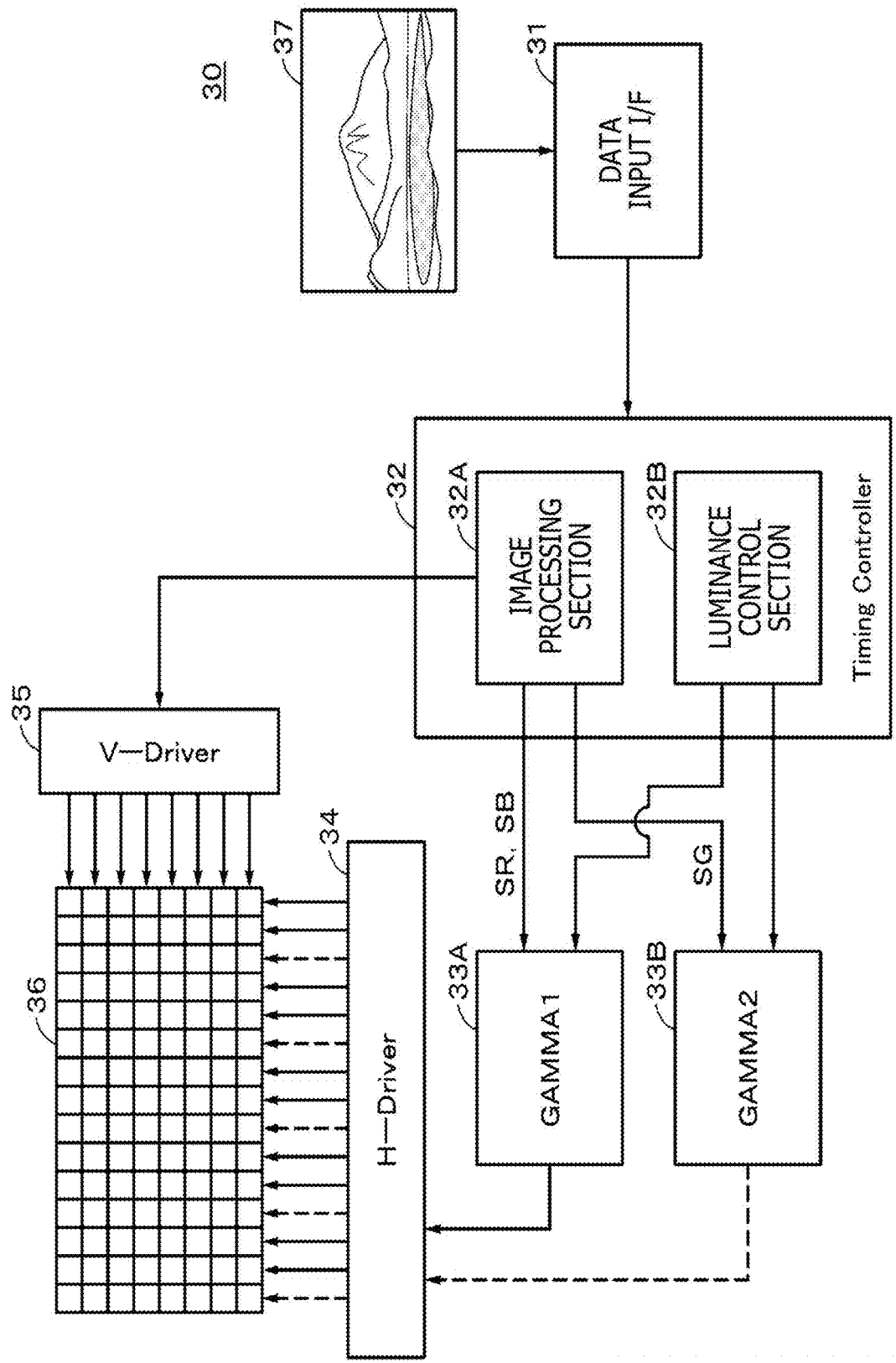
FIG. 4 is a block diagram illustrating an example of a configuration of a driving circuit.

FIG. 4 is a block diagram illustrating an example of a configuration of the driving circuit 30 included in the display apparatus 10 according to the embodiment. The driving circuit 30 includes an image data input interface (hereinafter referred to as a "data input I/F") 31, a timing controller 32, a gamma correction circuit 33A, a gamma correction circuit 33B, a horizontal scanning driver 34, and a vertical scanning driver 35.

The driving circuit 30 is a driving circuit based on a current amplitude modulation scheme. As described above, the green filter section 13G as a wavelength correcting layer is provided above the light emitting element 12G that shifts the wavelength. The luminance of the green subpixel 20G may be reduced by the provision of the green filter section 13G as described above. The driving circuit 30 is configured to be capable of controlling the luminance of the light emitting element 12G to compensate for such as a reduction in luminance. That is, the driving circuit 30 is configured to be capable of setting different gamma parameters for the light emitting elements 12G, 12R, and 12B to allow application of a gain corresponding to the reduction in luminance caused by the green filter section 13G.

The light emitting element array 36 includes multiple two-dimensionally arranged light emitting elements 12. Multiple signal lines and multiple scanning lines are provided on the first surface of the circuit board 11. The multiple signal lines and the multiple signal lines are arranged orthogonally to each other. Each of the multiple light emitting elements 12 is provided in a manner corresponding to an intersection between a respective one of the signal lines and a respective one of the scanning lines.

The timing controller 32, the gamma correction circuit 33A, and the gamma correction circuit 33B may include dedicated LSI (Large Scale Integration) or may include a computer system including an MPU (Micro-processing unit), a ROM (Read Only Memory), a RAM (Random Access Memory), and the like. The gamma correction circuit 33B may include an IC (Integrated Circuit) separately from the timing controller 32. The horizontal scanning driver 34 may include an IC. The vertical scanning driver 35 may include an IC.

The data input I/F 31 is an image input section used to input image data 37. The timing controller 32 includes an image processing section 32A and a luminance control section 32B. The image processing section 32A generates a vide signal SR, a video signal SG, and a video signal SB in reference to the image data 37 input via the data input I/F 31, feeds the video signal SR and the video signal SG to the gamma correction circuit 33A, and feeds the video signal SG to the gamma correction circuit 33B. Here, the video signal SR is a signal used to drive the red subpixel 20R, the video signal SG is a signal used to drive the green subpixel 20G, and the video signal SB is a signal used to drive the blue subpixel 20B. The video signal SR, the video signal SG, and the video signal SB may respectively be an R signal, a G signal, and a B signal. The image processing section 32A generates a scanning signal in reference to the image data 37 input via the data input I/F 31, and feeds the scanning signal to the vertical scanning driver 35.

The gamma correction circuit 33A gamma-corrects the video signal SR and the video signal SB fed from the image processing section 32A, and feeds the resultant video signals SR and SB to the horizontal scanning driver 34. The gamma correction circuit 33B gamma-corrects the video signal SG fed from the image processing section 32A, and feeds the resultant video signal SG to the horizontal scanning driver 34. Specifically, for example, the gamma correction circuit 33B gamma-corrects the video signal SG fed from the image processing section 32A, to compensate for a reduction in luminance caused by the color filter 13, which is the wavelength correcting layer. The display apparatus 10 includes the two gamma correction circuits, the gamma correction circuit 33A and the gamma correction circuit 33A, to separately gamma-correct the video signals for the green subpixel 20G including the green filter section 13G and the red and blue subpixels 20R and 20B including no filter section.

The horizontal scanning driver 34 controls the gradation of the red subpixel 20R by current amplitude modulation corresponding to the video signal SR fed from the gamma correction circuit 33A. More specifically, for example, in reference to the video signal SR fed from the gamma correction circuit 33A, the horizontal scanning driver 34 feeds a current signal with a predetermined amplitude to the red subpixel 20R selected via the signal line.

The horizontal scanning driver 34 controls the gradation of the green subpixel 20G by current amplitude modulation corresponding to the video signal SG fed from the gamma correction circuit 33B. More specifically, for example, in reference to the video signal SG fed from the gamma correction circuit 33B, the horizontal scanning driver 34 feeds a predetermined current value to the green subpixel 20G selected via the signal line.

The horizontal scanning driver 34 controls the gradation of the blue subpixel 20B by current amplitude modulation corresponding to the video signal SB fed from the gamma correction circuit 33A. More specifically, for example, in reference to the video signal SB fed from the gamma correction circuit 33A, the horizontal scanning driver 34 feeds a predetermined current value to the blue subpixel 20B selected via the signal line.

When the video signal is written to each subpixel 20, the vertical scanning driver 35 performs scanning on a per-row basis to sequentially feed the scanning signal to each scanning line.

[Effects]

The display apparatus 10 according to the embodiment includes the circuit board 11 including the driving circuit 30 based on the current amplitude modulation scheme, the multiple light emitting elements 12R, 12G, and 12B two-dimensionally arranged on the first surface of the circuit board 11, and the color filter (wavelength correcting layer) 13 that can correct the wavelength of light emitted from the multiple light emitting elements 12G (light subjected to a wavelength shift in response to a change in the current density of the light emitting element 12G). The driving circuit 30 includes the gamma correction circuits 33A and 33B that can independently gamma-correct the video signal (first signal) SG fed to the light emitting element (first light emitting element) 12G and the video signals (second signals) SR and SB respectively fed to the light emitting elements (second light emitting elements) 12R and 12B.

In the display apparatus 10 configured as described above, the light emitting element 12G emits light subjected to a wavelength shift in response to a change in the current density of the light emitting element 12G, and the light enters the green filter section 13G of the color filter 13. The green filter section 13G allows green light of light subjected to a wavelength shift to transmit therethrough, while blocking light other than the green light. The driving circuit 30 gamma-corrects (amplifies) the video signal SG to compensate for a reduction in luminance caused by the green filter section 13G, and uses the gamma-corrected video signal SG to drive the light emitting element 12G by the current amplitude modulation scheme. Thus, degradation of image quality that is caused by a possible color drift in the light emitting element 12G can be suppressed, with a reduction in the luminance of the green subpixel 20G being suppressed.

For display apparatuses driven by pulse width modulated drive, attempts have been made to develop high-definition displays by densifying circuits using micro-node technology, leading to significantly increased manufacturing costs.

In contrast, the display apparatus 10 according to the embodiment is driven by the current amplitude modulation scheme, and thus enables a reduction in circuit scale compared to display apparatuses driven by pulse width modulated drive. Therefore, the manufacturing costs can be reduced.

The display apparatus 10 according to the embodiment is driven by the current amplitude modulation scheme, and is thus subjected to no degradation of image quality (flickering), which is specific to the pulse width modulation scheme.

In the display apparatus 10 according to the embodiment, as the green light emitting element 12G, a general-purpose GaN-based LED element or the like can be used instead of a special, expensive LED element with a wavelength shift suppressed. Therefore, with an increase in the manufacturing costs of the display apparatus 10 being suppressed, degradation of image quality that is caused by a possible color drift can be inhibited.

For organic EL display apparatuses, a technology has been proposed in which a reduction in luminance caused by the color filter is suppressed by disposing a white subpixel with no color filter (that is, a white light emitting element) for a red subpixel, a green subpixel, and a blue subpixel each including a combination of a white light emitting element and a color filter. However, in this technology, one pixel needs to include four subpixels, leading to a complicated structure of the display apparatus. Accordingly, providing a high definition display apparatus may be difficult.

In contrast, the display apparatus 10 according to the embodiment includes the color filter (green filter section 13G) only above the green light emitting element 12G, allowing the structure of the display apparatus 10 to be simplified. Accordingly, the display apparatus 10 can easily be configured to provide high definition images.

In the display apparatus 10 according to the embodiment, the color filter 13 includes only the green filter section 13G. Thus, when the material of the green filter section 13G is selected, the materials of the blue filter section and the red filter section need not be taken into account, and the green filter section 13G has a high degree of freedom in material selection.

In general, in the color filter, a red color filter section, a green color filter section, and a blue color filter section include the same type of material. The blue filter is provided above the blue light emitting element having a short wavelength, and thus, the blue filter section is susceptible to significant photodegradation compared to the green filter section and the red filter section. Accordingly, the materials of the red color filter section, the green color filter section, and the blue color filter section are generally selected taking photodegradation of the blue filter into account.

In contrast, in the display apparatus 10 according to the embodiment, since the color filter 13 includes only the green filter section 13G, the material of the green filter section 13G can be selected without consideration for photodegradation of the blue filter section. Thus, the green filter section 13G has a higher degree of freedom in material section. This enables a reduction in the manufacturing costs of the display apparatus 10.

In the display apparatus 10 according to the embodiment, the color filter 13 does not include the blue filter section, which is susceptible to significant photodegradation compared to the green filter section 13G, and thus the color filter 13 can be disposed in proximity to the multiple light emitting elements 12. Thus, the display apparatus 10 can provide improved luminous efficiency.

The display apparatus 10 according to the embodiment eliminates the need to arrange the three color filters in association with the respective pixels, enabling a reduction in the number of manufacturing steps.

In the display apparatus 10 according to the embodiment, the red subpixel 20R and the blue subpixel 20B include no filter section, thus allowing prevention of a reduction in luminance of the red subpixel 20R and the blue subpixel 20B caused by the color filter.

The color filter 13 including only the green filter section 13G enables an increase in misalignment margin for the color filter 13 compared to a color filter including a red color filter section, a green color filter section, and a blue color filter section.

2. Variations (Variation 1)

In the example described above in the embodiment, the display apparatus 10 includes the color filter 13 as the wavelength correcting layer. However, the wavelength correcting layer is not limited to the color filter 13.

Figure 5:
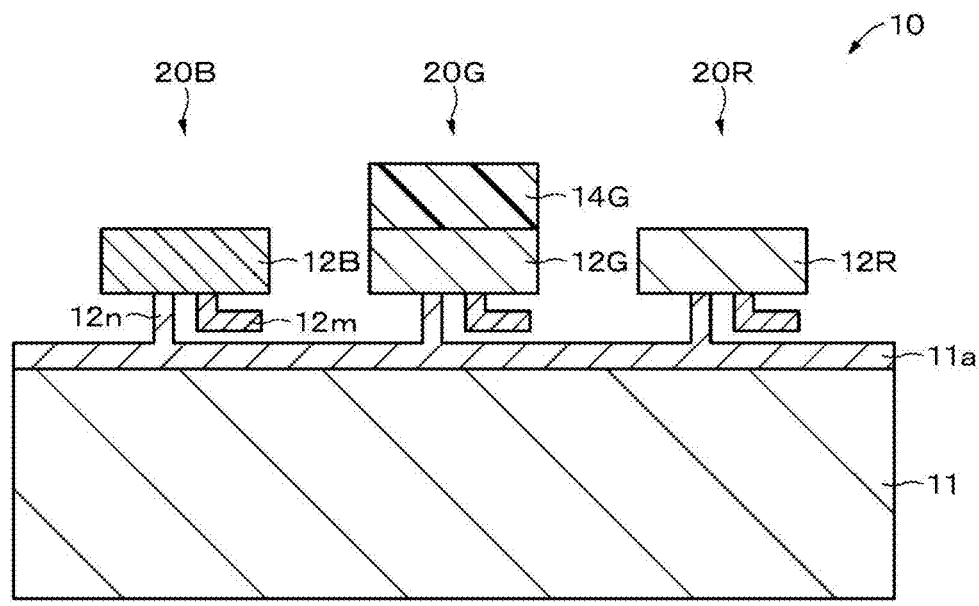
FIG. 5 is a cross-sectional view illustrating an example of a configuration of a display apparatus according to a variation.

For example, as illustrated in FIG. 5, the display apparatus 10 may include a color converting layer 14G instead of the color filter 13, as a wavelength correcting layer. The color converting layer 14G can convert, into green light, light subjected to a wavelength shift in response to a change in the current density of the light emitting element 12G. That is, the color converting layer 14G can correct an emission wavelength shift caused in response to a change in the current density of the light emitting element 12G.

The color converting layer 14G may be provided directly on or above a first surface of the light emitting element 12. Note that FIG. 5 illustrates an example in which the color converting layer 14G is provided on the first surface of the light emitting element 12. The color converting layer 14G includes at least one type selected from the group including, for example, quantum dots (semiconductor particles), phosphors, and the like.

Figure 6:
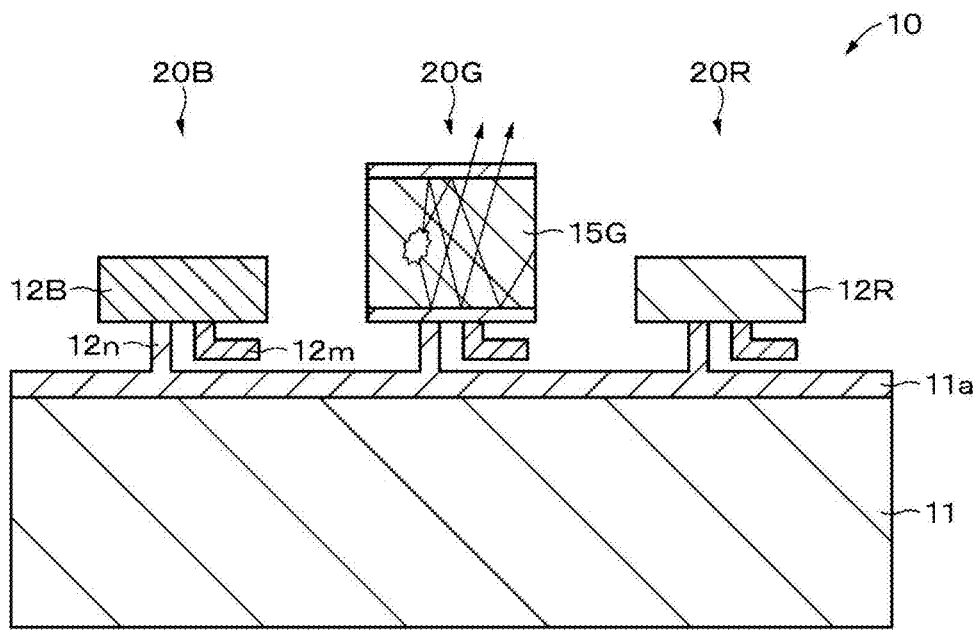
FIG. 6 is a cross-sectional view illustrating an example of a configuration of the display apparatus according to a variation.

For example, as illustrated in FIG. 6, the display apparatus 10 may include, instead of the light emitting element 12G, a compound semiconductor light emitting element 15G (hereinafter referred to as a "light emitting element 15G") also including the functions of a wavelength correcting layer. The light emitting element 15G includes a resonator structure. The resonator structure is configured to be capable of resonating and emphasizing green light included in light subjected to a wavelength shift in response to a change in the current density of the light emitting element 15G. Therefore, the resonator structure can correct the light subjected to a wavelength shift in response to a change in the current density of the light emitting element 15G.

Figure 7:
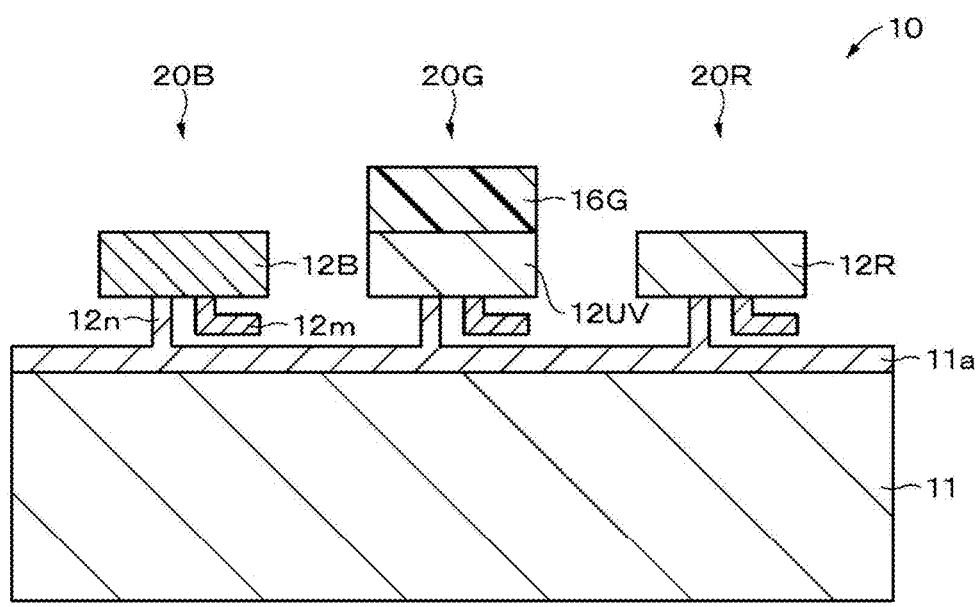
FIG. 7 is a cross-sectional view illustrating an example of a configuration of the display apparatus according to a variation.

For example, as illustrated in FIG. 7, the display apparatus 10 may include a compound semiconductor light emitting element 12UV (hereinafter referred to as a "light emitting element 12UV") instead of the light emitting element 12G and a color converting layer 16G instead of the color filter 13, as a wavelength correcting layer. The light emitting element 12UV can emit ultraviolet light. The light emitting element 12B is, for example, a UV LED element.

The color converting layer 16G can convert, into green light, ultraviolet light emitted from the light emitting element 12UV. The color converting layer 16G may be provided directly on or above a first surface of the light emitting element 12UV. Note that FIG. 7 illustrates an example in which the color converting layer 16G is provided on the first surface of the light emitting element 12UV. The color converting layer 16G includes at least one type selected from the group including, for example, quantum dots (semiconductor particles), phosphors, and the like.

(Variation 2)

Figure 8:
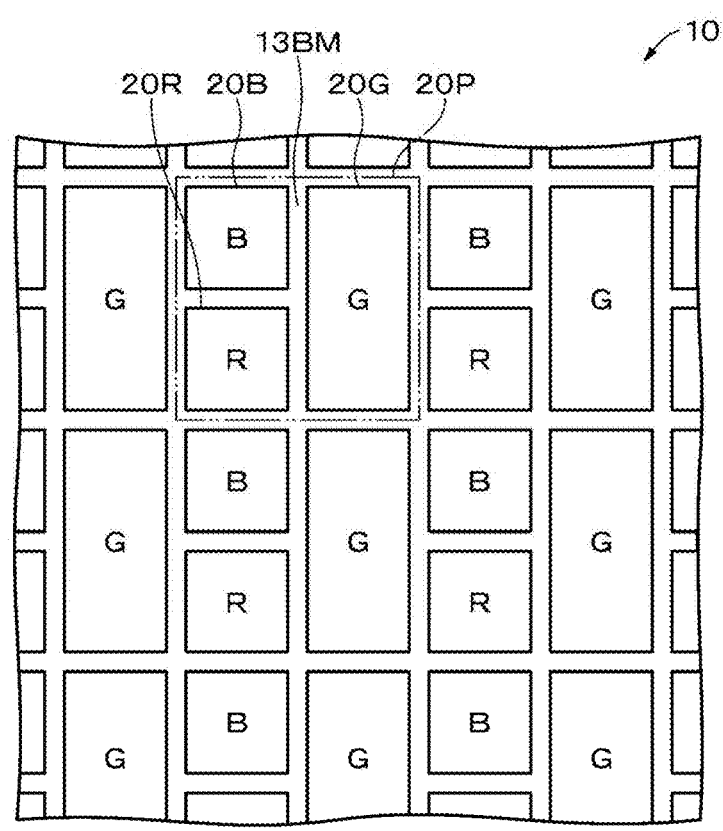
FIG. 8 is a plan view illustrating an example of a configuration of the display apparatus according to a variation.

In the example described above in the embodiment, the red subpixel 20R, the green subpixel 20G, and the blue subpixel 20B have the same area. However, as illustrated in FIG. 8, the green subpixel 20G has a larger area than each of the red subpixel 20R and the blue subpixel 20B. This enables suppression of a reduction in the luminance of the green subpixel 20G caused by the color filter 13. For example, the green subpixel 20G has an area double the area of the red subpixel 20R or the blue subpixel 20B.

Figure 9:
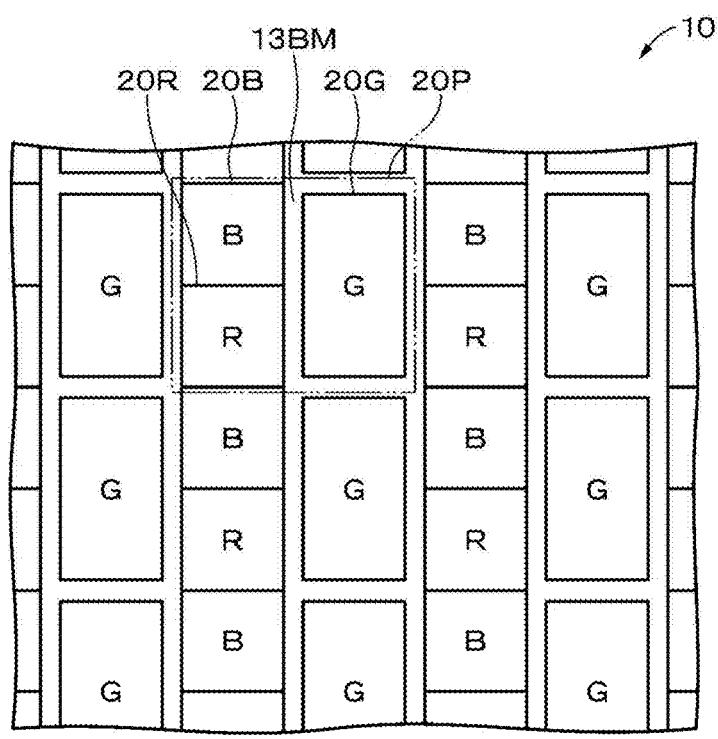
FIG. 9 is a plan view illustrating an example of a configuration of the display apparatus according to a variation.

In a case where the green subpixel 20G has a larger area than each of the red subpixel 20R and the blue subpixel 20B, then as illustrated in FIG. 9, the light blocking section 13BM may be provided only around the green subpixel 20G among the red subpixel 20R, the green subpixel 20G, and the blue subpixel 20B. The green subpixel 20G has a larger area than each of the red subpixel 20R and the blue subpixel 20B, and thus, even with the light blocking section 13BM provided around the green subpixel 20G, a reduction in the area of the green subpixel 20G can be suppressed. Therefore, a reduction in the luminance of the green subpixel 20G that is caused by the provision of the light blocking section 13BM can be suppressed.

(Variation 3)

Figure 10:
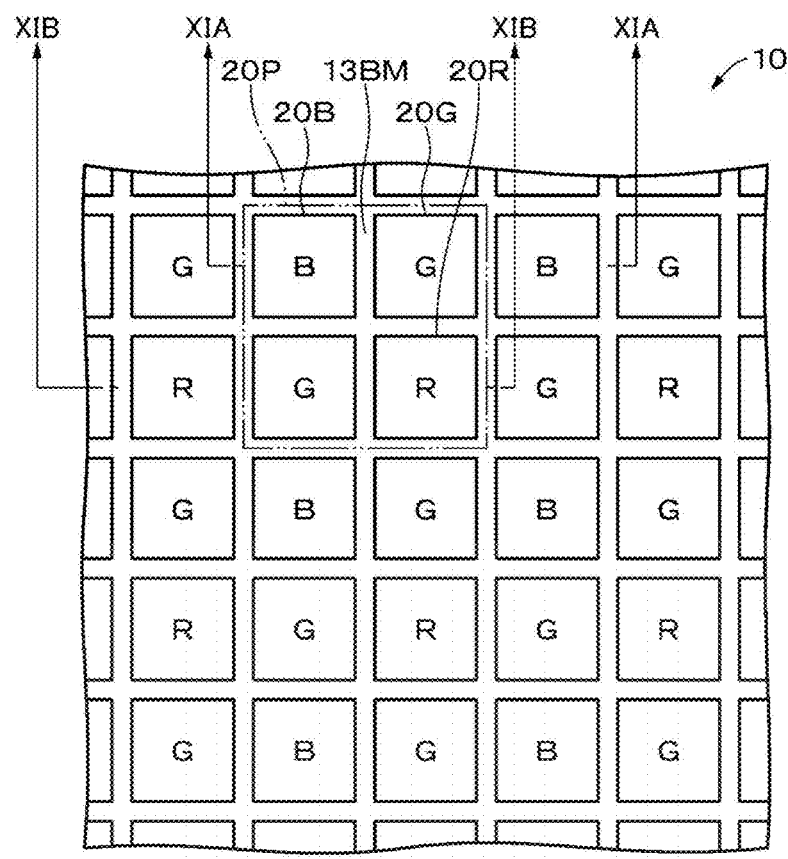
FIG. 10 is a plan view illustrating an example of a configuration of the display apparatus according to a variation.
Figure 11A:
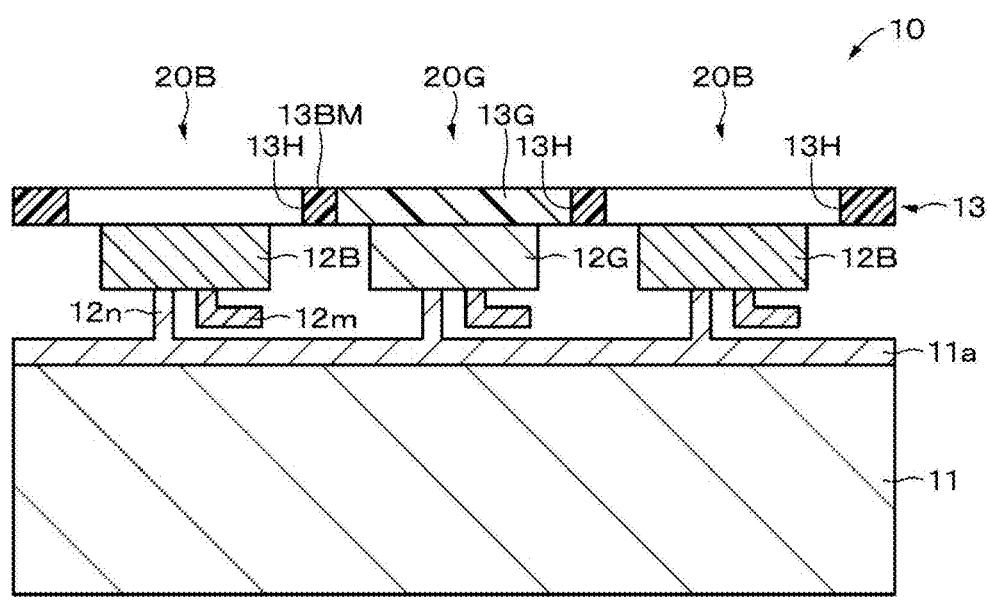
[FIGS. 11A and 11B]
Figure 11B:
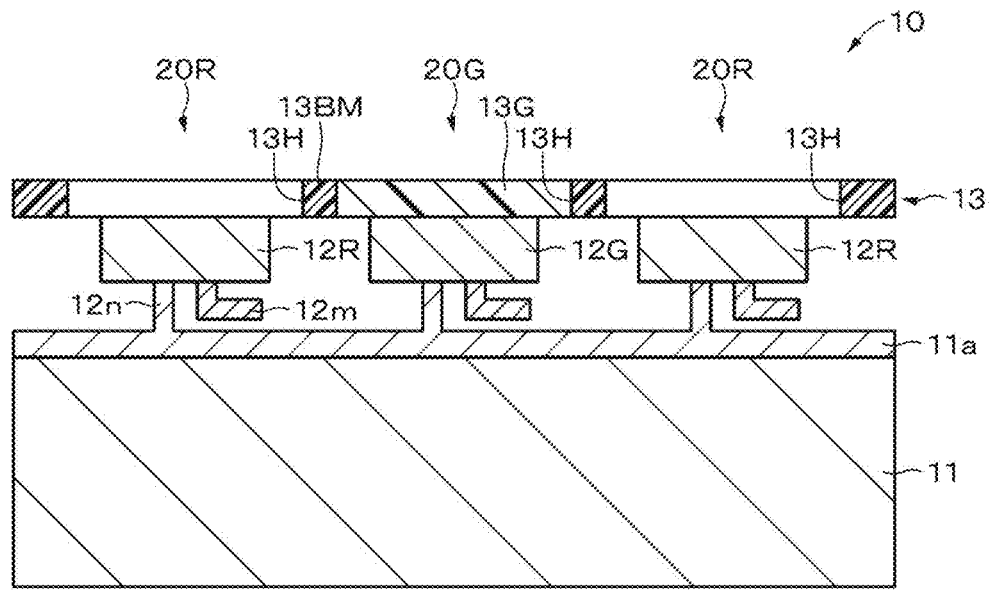

In the example described above in the embodiment, the pixel 20P includes one red subpixel 20R, one green subpixel 20G, and one blue subpixel 20B. However, as illustrated in FIGS. 10, 11A, and 11B, the pixel 20P may include one red subpixel 20R, two green subpixels 20G, and one blue subpixel 20B. As illustrated in FIGS. 11A and 11B, the color filter 13 may be provided adjacent to the multiple light emitting elements 12. This makes it possible to restrain emitted light from the light emitting element 12R and the light emitting element 12B from entering the green filter section 13G, thus allowing color mixture to be inhibited.

(Variation 4)

Figure 12:
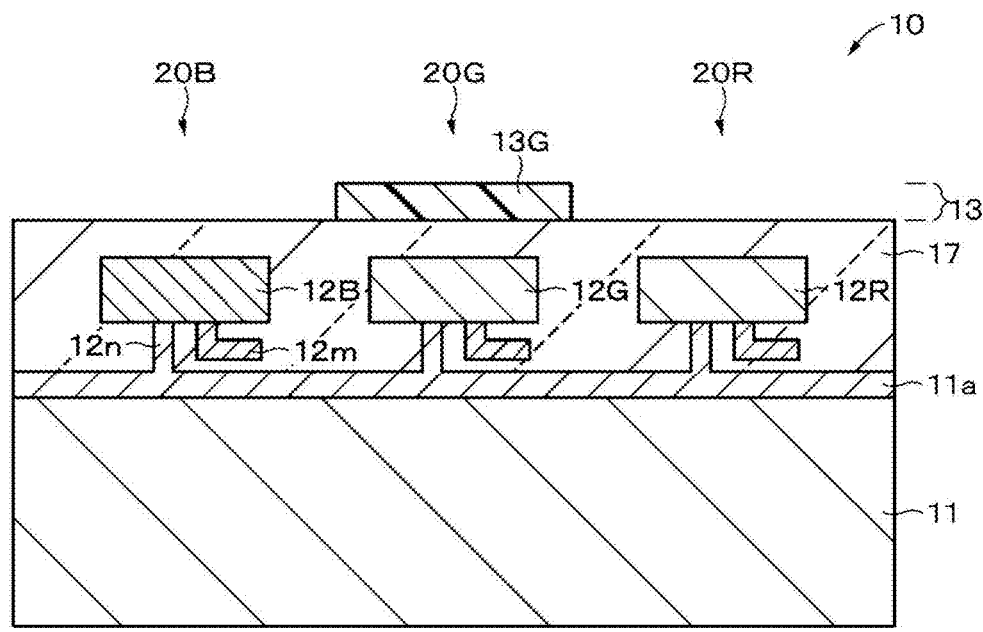
FIG. 12 is a cross-sectional view illustrating an example of a configuration of the display apparatus according to a variation.

As illustrated in FIG. 12, the display apparatus 10 may include a protective layer 17 on the first surface of the circuit board 11. The multiple light emitting elements 12 are provided in the protective layer 17. The protective layer 17 can shield the multiple light emitting elements 12 from outside air to suppress infiltration of moisture from an external environment into the light emitting elements 12. The protective layer 17 has insulation properties and is transparent to visible light. In the specification, the visible light refers to light having a wavelength range of 360 to 830 nm inclusive.

The protective layer 17 includes, for example, polymer resin or an inorganic material that is low in moisture absorbency. The polymer resin includes at least one type selected from the group including, for example, thermosetting resin, ultraviolet curable resin, and the like. The polymer resin may be an underfill material. The inorganic material includes at least one type selected from the group including, for example, silicon oxide ($SiO_x$), silicon nitride ($SiN_x$), silicon oxynitride ($SiO_xN_y$), titanium oxide ($TiO_2$), aluminum oxide ($AlO_x$), and the like.

Figure 13:
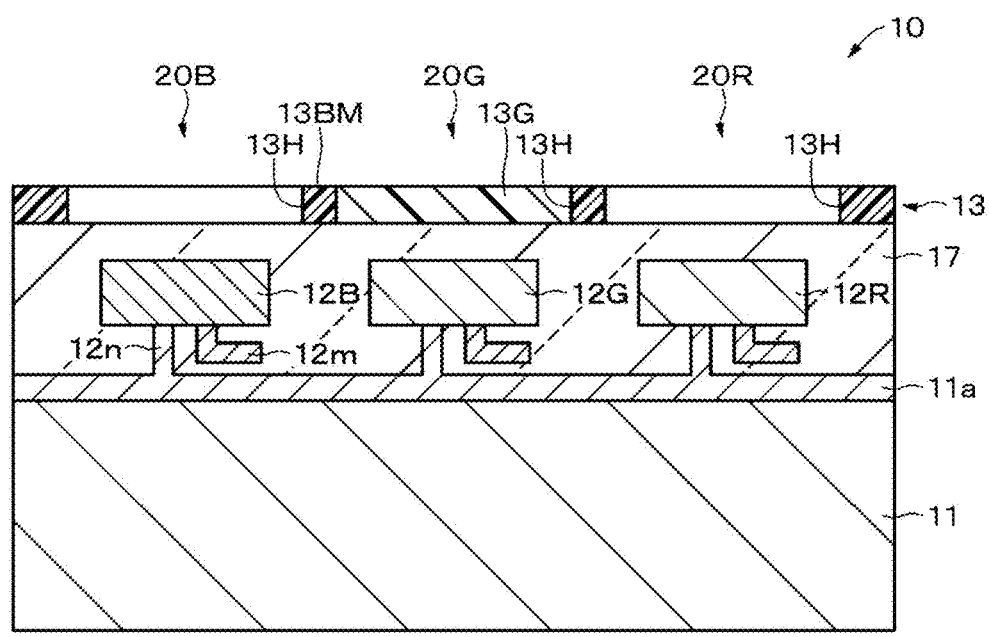
FIG. 13 is a cross-sectional view illustrating an example of a configuration of the display apparatus according to a variation.

In a case where the display apparatus 10 includes the protective layer 17 on the first surface of the circuit board 11 as described above, the color filter 13 may be provided on a first surface of the protective layer 17. The color filter 13 need not include the light blocking section 13BM as illustrated in FIG. 12 or may include the light blocking section 13BM as illustrated in FIG. 13.

(Variation 5)

In the example described above in the embodiment, the green filter section 13G is provided above a first surface of the light emitting element 12G. However, as illustrated in FIG. 14, the green filter section 13G may be provided directly on the first surface of the light emitting element 12G.

Figure 14:
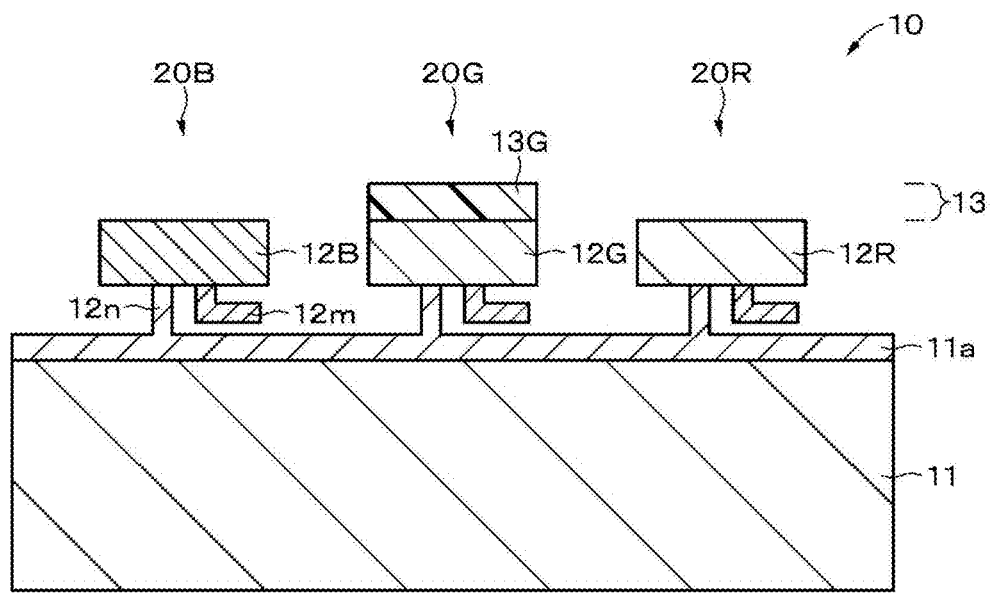
FIG. 14 is a cross-sectional view illustrating an example of a configuration of the display apparatus according to a variation.

FIG. 14 illustrates an example in which the color filter 13 does not include the light blocking section 13BM (see FIG. 2). However, the color filter 13 may include the light blocking section 13BM. In this case, some of the multiple openings 13H may each be provided on a first surface of the light emitting element 12R, and the rest of the multiple openings 13H may each be provided on a first surface of the light emitting element 12B.

(Variation 6)

Figure 15:
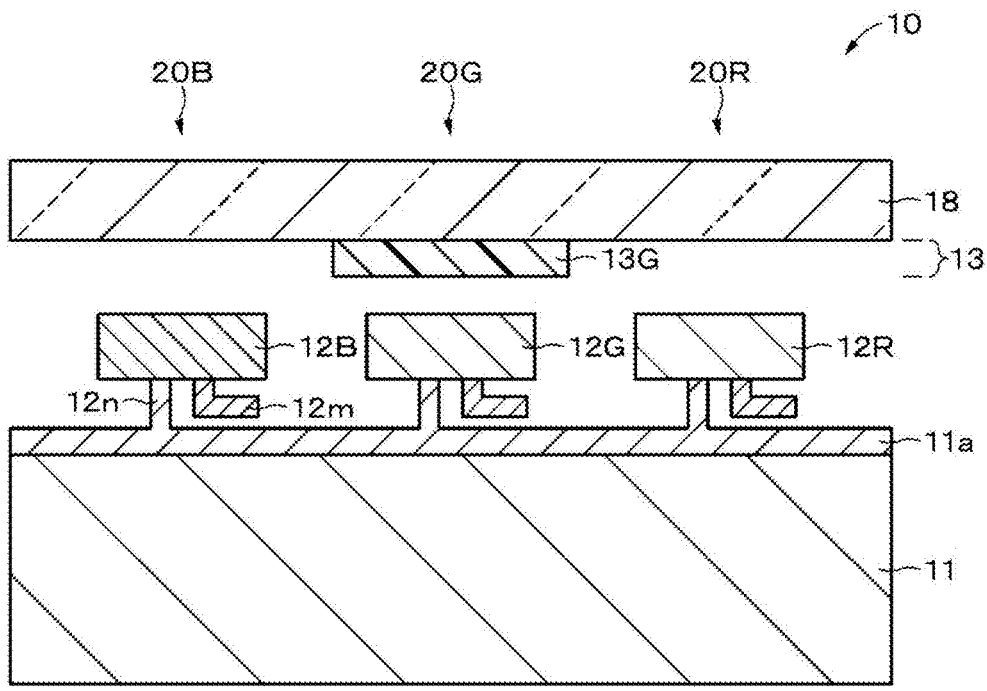
FIG. 15 is a cross-sectional view illustrating an example of a configuration of the display apparatus according to a variation.

As illustrated in FIG. 15, the display apparatus 10 may include a counter board 18 facing the first surface of the circuit board 11. In this case, the counter board 18 may include the color filter 13 on a second surface of the counter board 18 that is opposite to the circuit board 11. FIG. 15 illustrates an example in which the color filter 13 does not include the light blocking section 13BM (see FIG. 2). However, the color filter 13 may include the light blocking section 13BM. The counter board 18 is transparent to visible light. The counter board 18 includes, for example, glass or polymer resin.

(Variation 7)

Figure 16:
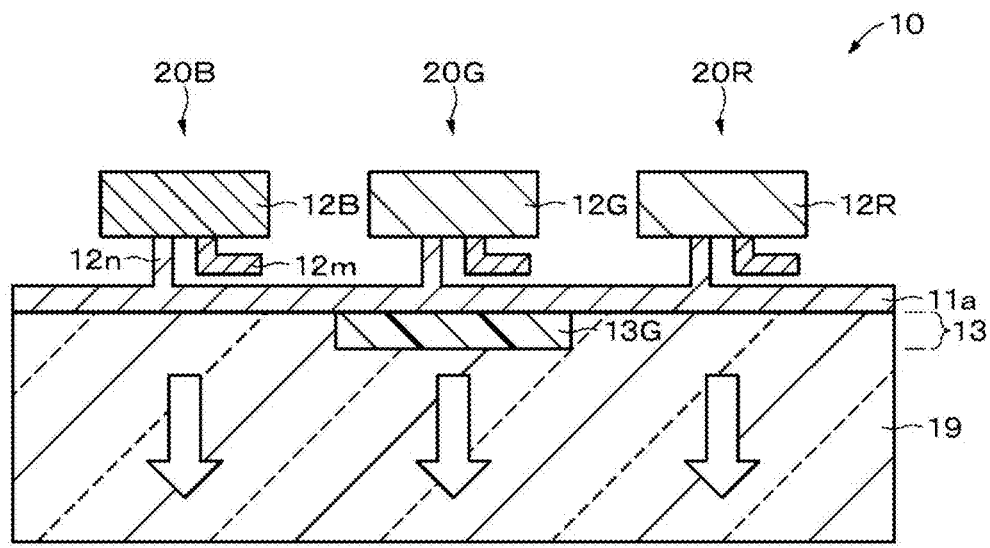
FIG. 16 is a cross-sectional view illustrating an example of a configuration of the display apparatus according to a variation.

In the example described above in the embodiment, the display apparatus 10 has a top emission type structure in which light emitted from the light emitting element 12 is captured from a side of the display apparatus 10 opposite to the circuit board 11 (see FIG. 2). However, as illustrated in FIG. 16, the display apparatus 10 may have a bottom emission type structure in which light emitted from the light emitting element 12 is captured from a circuit board 19 side. In this case, the circuit board 19 is transparent to visible light. The color filter 13 may be provided on a first surface of the circuit board 19. FIG. 16 illustrates an example in which the color filter 13 does not include the light blocking section 13BM (see FIG. 2). However, the color filter 13 may include the light blocking section 13BM.

(Variation 8)

Figure 17:
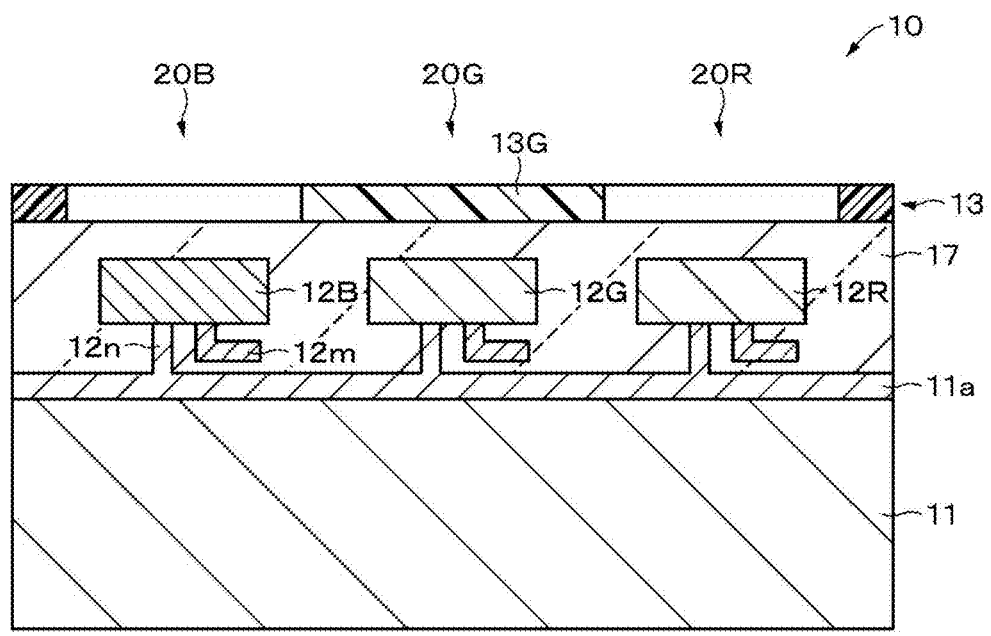
FIG. 17 is a cross-sectional view illustrating an example of a configuration of the display apparatus according to a variation.

In the example described above in the embodiment, the light blocking section 13BM is provided around the green filter section 13G in a manner surrounding the green filter section 13G. However, in an alternative configuration, the light blocking section 13BM need not be provided around the green filter section 13G as illustrated in FIG. 17.

(Variation 9)

Figure 18:
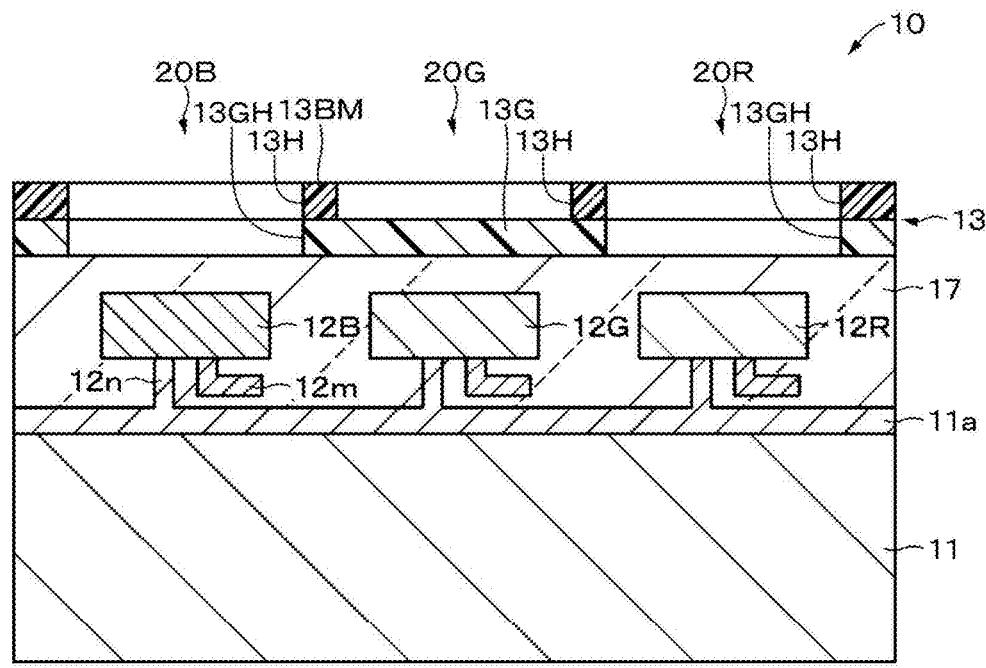
FIG. 18 is a cross-sectional view illustrating an example of a configuration of the display apparatus according to a variation.

In the example described above in the embodiment, the light blocking section 13BM and the green filter section 13G are provided in the same layer. However, as illustrated in FIG. 18, the light blocking section 13BM may be provided on the green filter section 13G. In this case, the green filter section 13G may include multiple openings 13GH. The opening 13GH penetrates the display apparatus 10 in the thickness direction. Some of the multiple openings 13GH are each provided above the light emitting element 12R, and the rest of the multiple openings 13GH are each provided above the light emitting element 12B.

Figure 19:
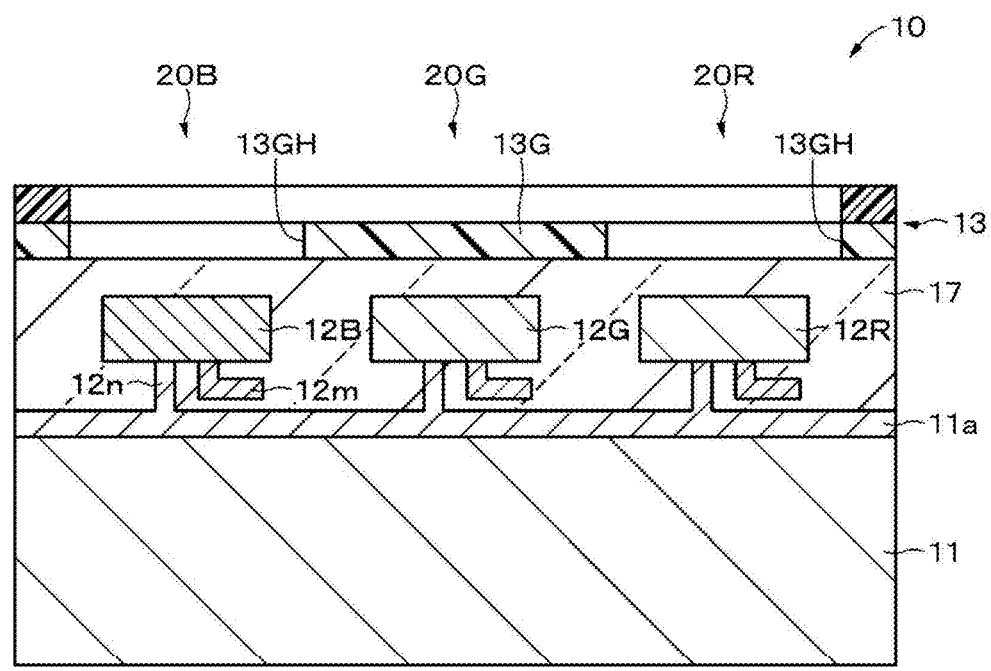
FIG. 19 is a cross-sectional view illustrating an example of a configuration of the display apparatus according to a variation.

FIG. 18 illustrates an example in which the light blocking section 13BM is provided on an upper surface of the green filter section 13G provided above the light emitting element 12G. However, in an alternative configuration, the light blocking section 13BM need not be provided on the upper surface of the green filter section 13G provided above the light emitting element 12G as illustrated in FIG. 19.

(Variation 10)

Figure 21:
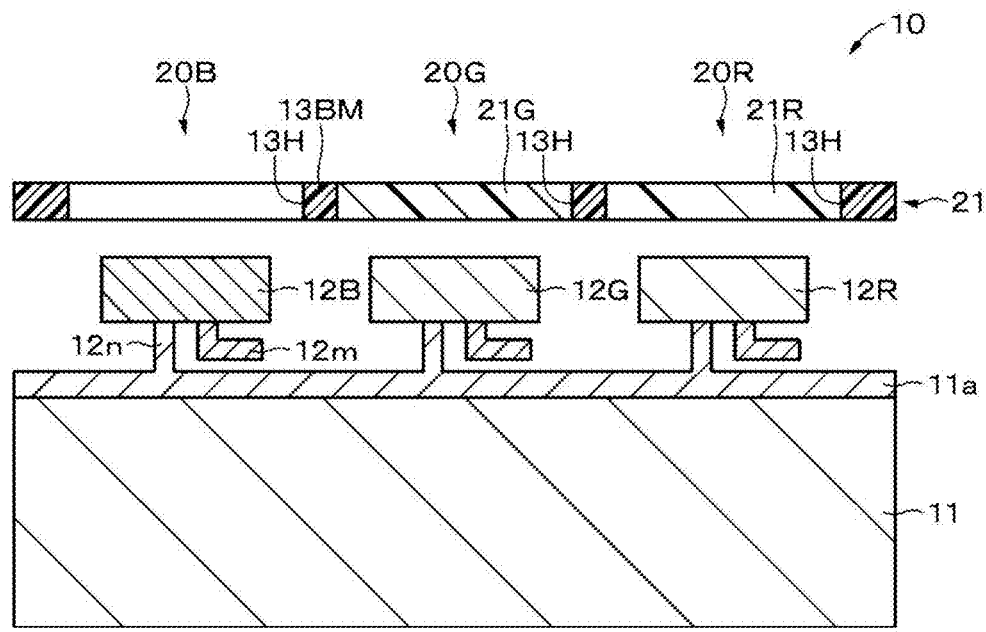
FIG. 21 is a cross-sectional view illustrating an example of a configuration of the display apparatus according to a variation.

In the example described above in the embodiment, the display apparatus 10 includes the color filter 13 as a wavelength correcting layer. However, as illustrated in FIG. 21, the display apparatus 10 may include a wavelength cut filter 21 as a wavelength correcting layer. The wavelength cut filter 21 may include a wavelength cut filter section 21G and the light blocking section 13BM.

FIG. 20 is a diagram illustrating examples of emission spectra of the light emitting element 12G obtained at the time of weak excitation and at the time of strong excitation. The emission spectrum of the light emitting element 12G, for example, shifts toward shorter wavelengths in response to an increase in current density. In this case, the wavelength cut filter section 21G is a short-wavelength cut filter section that can cut off light with a wavelength shorter than a first defined wavelength (first cutoff wavelength). More specifically, for example, the wavelength cut filter section 21G is a short-wavelength cut filter section that can cut off light with a wavelength shorter than the wavelengths in the wavelength range of green light.

In a case where the emission spectrum of the light emitting element 12R also shifts toward shorter wavelengths in response to an increase in current density, the wavelength cut filter 21 may include a wavelength cut filter section 21R above the light emitting element 12R as illustrated in FIG. 21. The wavelength cut filter section 21R is a short-wavelength cut filter section that can cut off light with a wavelength shorter than a second defined wavelength (second cutoff wavelength). More specifically, for example, the wavelength cut filter section 21R is a short-wavelength cut filter that can cut off light with a wavelength shorter than the wavelengths in the wavelength range of red light.

(Variation 11)

Figure 22:
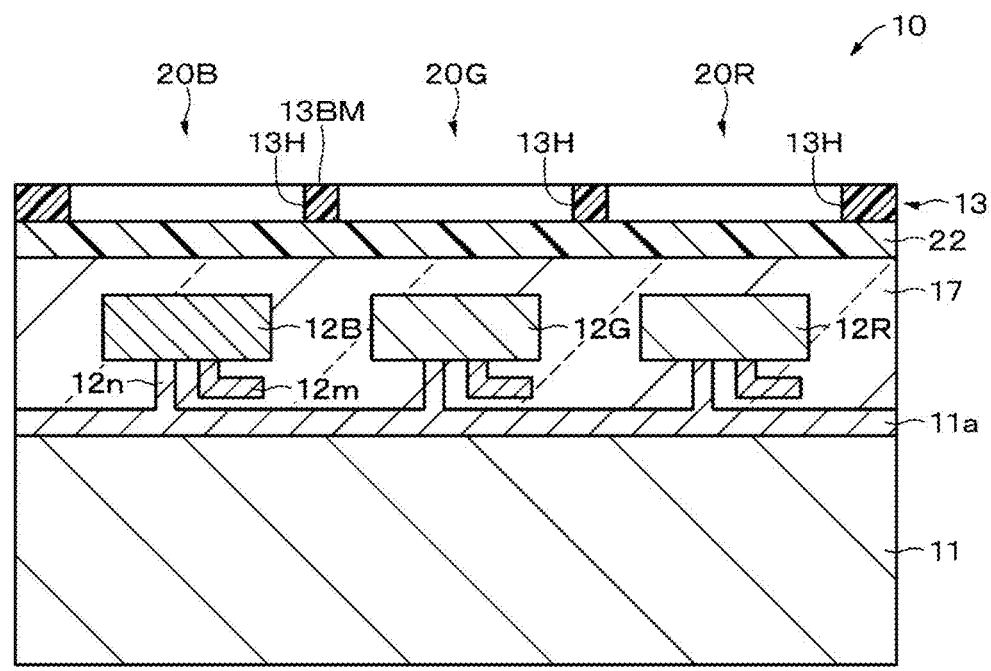
FIG. 22 is a cross-sectional view illustrating an example of a configuration of the display apparatus according to a variation.
Figure 23:
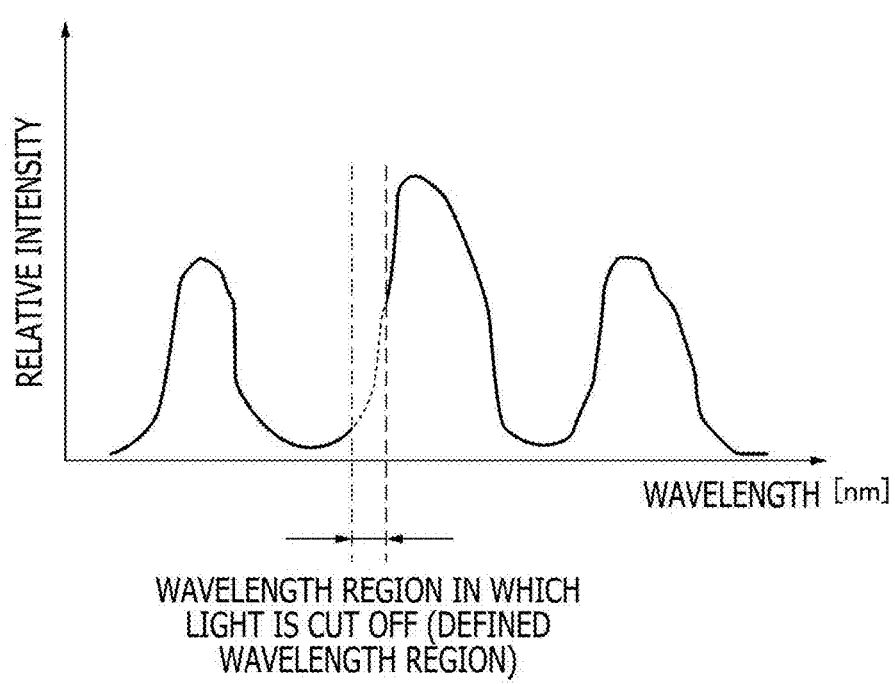
FIG. 23 is a diagram illustrating an emission spectrum of each compound semiconductor light emitting element.

In the example described above in the embodiment, the display apparatus 10 includes the color filter 13 as a wavelength correcting layer. However, as illustrated in FIG. 22, the display apparatus 10 may include a bandpass filter 22 as a wavelength correcting layer. As illustrated in FIG. 23, the bandpass filter 22 cuts off light in a defined wavelength range included in visible range light, while being capable of allowing light having a wavelength other than the defined wavelength and included in the visible range light to transmit therethrough. The bandpass filter 22 may have a film shape. The bandpass filter 22 may be a light absorbing material. The bandpass filter 22 preferably has transmission characteristics thereof adapted to a higher luminance side of the spectrum of the light emitting element 12. The bandpass filter 22 may be provided substantially all over the display region of the display apparatus 10 and shared by multiple light emitting elements 12. In this case, a filter need not be formed for each subpixel 20, allowing the manufacturing steps to be simplified. Additionally, the filter need not be precisely aligned for each subpixel 20.

As illustrated in FIG. 22, the display apparatus 10 may include the protective layer 17. In this case, the display apparatus 10 includes the bandpass filter 22 on the first surface of the protective layer 17. The display apparatus 10 may further include the light blocking section 13BM on a first surface of the bandpass filter 22.

(Variation 12)

In the examples described above in the embodiment and the variations, the green light emitting element 12G is configured to cause an emission wavelength shift in response to a change in current density, and the wavelength correcting section such as the green filter section 13G is provided on or above the light emitting element 12G. The present disclosure is not limited to this configuration.

For example, the red light emitting element 12R may be configured to cause an emission wavelength shift in response to a change in current density, and the wavelength correcting section such as the red filter section may be provided on or above the light emitting element 12R. The blue light emitting element 12B may be configured to cause an emission wavelength shift in response to a change in current density, and the wavelength correcting section such as the blue filter section may be provided on or above the light emitting element 12B. Two or more subpixels 20 constituting the pixel 20P may include the light emitting element 12 and the wavelength correcting section configured to cause an emission wavelength shift in response to a change in current density.

(Variation 13)

In the example described above in Variation 1, the green light emitting element 15G is configured to cause an emission wavelength shift in response to a change in current density, and has a resonator structure that can resonate and emphasize green light included in light subjected to a wavelength shift in response to a change in the current density of the light emitting element 15G (see FIG. 6). The present disclosure is not limited to this.

The red light emitting element 12R may be configured to cause an emission wavelength shift in response to a change in current density, and have a resonator structure that can resonate and emphasize red light included in light subjected to a wavelength shift in response to a change in the current density of the light emitting element 12R. For example, in a case where the light emitting element 12R is a GaN-based compound semiconductor light emitting element, the emission spectrum of the light emitting element 12R shifts toward shorter wavelengths in response to an increase in current density. The blue light emitting element 12B may be configured to cause an emission wavelength shift in response to a change in current density, and have a resonator structure that can resonate and emphasize blue light included in light subjected to a wavelength shift in response to a change in the current density of the light emitting element 12B.

Two or more subpixels 20 constituting the pixel 20P may be configured to cause an emission wavelength shift in response to a change in current density, and have a resonator structure that can resonate and emphasize light of a defined color included in light subjected to a wavelength shift in response to a change in the current density of the light emitting element 12.

(Other Variations)

The embodiment of the present disclosure and the variations of the embodiment have been specifically described above. However, the present disclosure is not limited to the embodiment and the variations thereof described above, and can be subjected to many variations based on the technical concepts of the present disclosure.

For example, the configurations, methods, steps, shapes, materials, numerical values, and the like cited in the embodiment and the variations thereof described above are only examples, and different configurations, methods, steps, shapes, materials, numerical values, and the like may be used as necessary.

For example, the configurations, methods, steps, shapes, materials, numerical values, and the like cited in the embodiment and the variations thereof described above can be combined together without departing from the gist of the present disclosure.

For example, any one type of the materials illustrated in the embodiment and the variations thereof described above can independently be used or two or more types can be combined together unless otherwise noted. Further, the present disclosure can also take the following configurations.

(1)

A display apparatus including:

a board including a driving circuit based on a current amplitude modulation scheme;

multiple first light emitting elements and multiple second light emitting elements two-dimensionally arranged on the board; and a wavelength correcting layer that is able to correct wavelengths of light emitted from the multiple first light emitting elements, in which the driving circuit is able to independently gamma-correct a first signal fed to each of the first light emitting elements and a second signal fed to each of the second light emitting elements.

(2)

The display apparatus according to (1), in which the first light emitting element is configured to cause an emission wavelength shift in response to a change in current density.

(3)

The display apparatus according to (1) or (2), in which the driving circuit is able to control luminance of the first light emitting element to compensate for a reduction in luminance caused by the wavelength correcting layer.

(4)

The display apparatus according to any one of (1) through (3), in which the wavelength correcting layer is provided only on or above the multiple first light emitting elements.

(5)

The display apparatus according to any one of (1) through (4), in which the multiple first light emitting elements each include a first compound semiconductor light emitting element that is able to emit green light.

(6)

The display apparatus according to (5), in which the multiple second light emitting elements each include multiple second compound semiconductor light emitting elements that is able to emit red light and multiple third compound semiconductor light emitting elements that is able to emit blue light.

(7)

The display apparatus according to any one of (1) through (4), in which the multiple first light emitting elements each include one type of light emitting element or two types of light emitting elements selected from a group including a first compound semiconductor light emitting element that is able to emit green light, a second compound semiconductor light emitting element that is able to emit red light, and a third compound semiconductor light emitting element that is able to emit blue light.

(8)
The display apparatus according to (7), in which
the multiple second light emitting elements each include light emitting elements other than the one type of light emitting element or the two types of light emitting elements.

(9)
The display apparatus according to any one of (1) through (8), in which
the first light emitting element includes a GaN-based compound semiconductor light emitting element.

(10)
The display apparatus according to any one of (1) through (9), in which
a peak wavelength of the first light emitting element at a time of weak excitation is closer to a central wavelength of the wavelength correcting layer than a peak wavelength of the first light emitting element at a time of strong excitation.

(11)
The display apparatus according to any one of (1) through (10), in which
the wavelength correcting layer is a color filter.

(12)
The display apparatus according to any one of (1) through (9), in which
the wavelength correcting layer is a wavelength cut filter.

(13)
The display apparatus according to any one of (1) through (9), in which
the wavelength correcting layer is a color converting layer.

(14)
The display apparatus according to any one of (1) through (10), in which
the wavelength correcting layer is a bandpass filter.

(15)
The display apparatus according to any one of (1) through (10), in which
the wavelength correcting layer is provided on or above the multiple first light emitting elements and the multiple second light emitting elements, and
the wavelength correcting layer blocks light in a part of a wavelength range of the first light emitting element, while allowing light in the rest of the wavelength range to transmit therethrough.

(16)
The display apparatus according to any one of (1) through (15), in which
the first light emitting element and the wavelength correcting layer constitute a first subpixel,
the second light emitting element constitutes a second subpixel, and
the first subpixel has a larger area than the second subpixel.

(17)
The display apparatus according to any one of (1) through (16), in which
the wavelength correcting layer includes multiple wavelength correcting sections and a light blocking section,
each of the wavelength correcting sections is provided on or above the first light emitting element, and
the light blocking section is provided around or on the wavelength correcting section.

(18)
A display apparatus including:
a board including a driving circuit based on a current amplitude modulation scheme; and
multiple first light emitting elements and multiple second light emitting elements two-dimensionally arranged on the board, in which
each of the first light emitting elements has a resonator structure that is able to correct light emitted from the first light emitting element, and
the driving circuit is able to independently gamma-correct a first signal fed to each of the first light emitting elements and a second signal fed to each of the second light emitting elements.

(19)
The display apparatus according to (18), in which
the first light emitting element is configured to cause an emission wavelength shift in response to a change in current density, and
the resonator structure is able to resonate and emphasize light of a defined color included in light subjected to a wavelength shift in response to a change in the current density of the first light emitting element.

(20)
Electronic equipment including:
the display apparatus according to any one of (1) through (19).

3. Applied Example (Electronic Equipment)

The display apparatus 10 according to the embodiment and the variations thereof described above may be provided in various types of electronic equipment. In particular, the display apparatus 10 is preferably provided in electronic equipment that requires high resolution, that enables magnification, and that is used close to the eyes, such as an electronic viewfinder of a video camera or a single-lens reflex camera or a head mounted display.

Specific Example 1

Figure 24A:
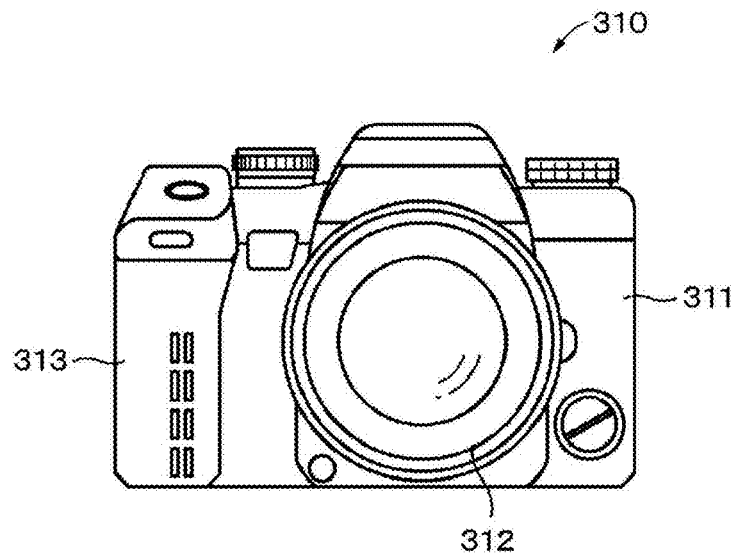
[FIGS. 24A and 24B]
Figure 24B:
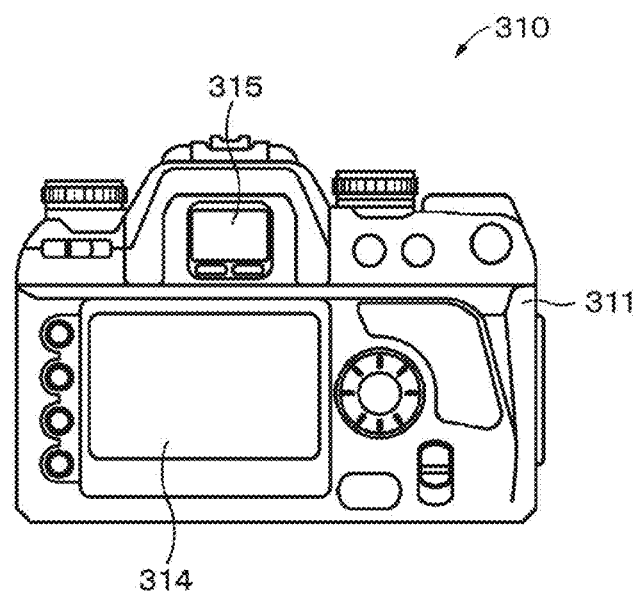

FIG. 24A is a front view illustrating an example of appearance of a digital still camera 310. FIG. 24B is a rear view illustrating an example of appearance of the digital still camera 310. The digital still camera 310 is of an interchangeable single-lens reflex type, and includes an interchangeable photographing lens unit (interchangeable lens) 312 generally in the center of the front of a camera main body section (camera body) 311, and a grip section 313 in the left of the front, that is to be gripped by a photographer.

A monitor 314 is positioned to the left of the center of the rear surface of the camera main body section 311. An electronic viewfinder (ocular window) 315 is provided above the monitor 314. The photographer can peer through the electronic viewfinder 315 to view a light image of a subject guided from the photographing lens unit 312 and determine a composition. The electronic viewfinder 315 includes the display apparatus 10.

Specific Example 2

Figure 25:
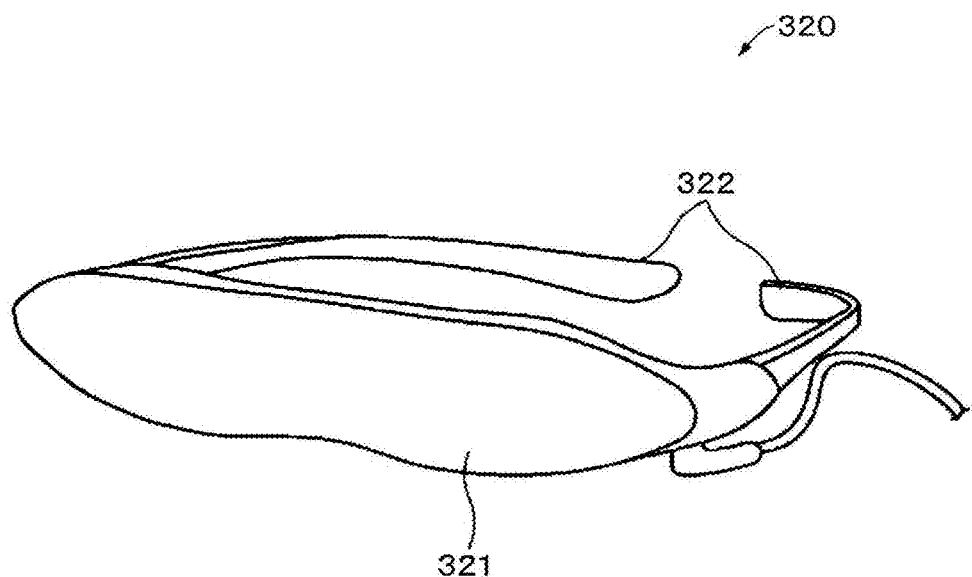
FIG. 25 is a perspective view illustrating an example of appearance of a head mounted display.

FIG. 25 is a perspective view illustrating an example of appearance of a head mounted display 320. The head mounted display 320 includes, for example, behind-the-ear sections 322 on the opposite sides of an eyewear display section 321 for mounting to the head of the user. The display section 321 includes the display apparatus 10.

Specific Example 3

Figure 26:
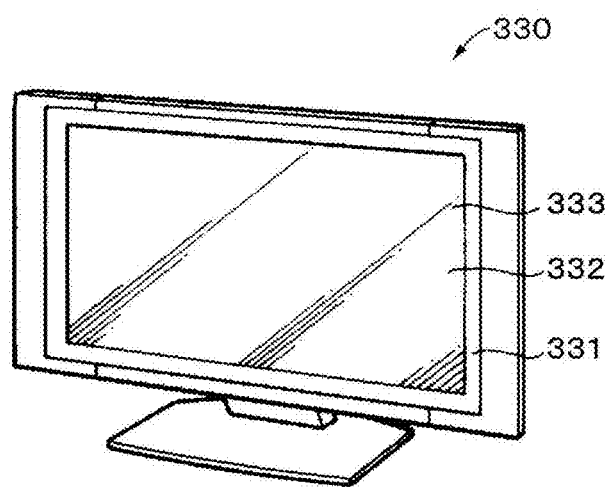
FIG. 26 is a perspective view illustrating an example of appearance of a television apparatus.

FIG. 26 is a perspective view illustrating an example of appearance of a television apparatus 330. The television apparatus 330 includes, for example, a video display screen section 331 including a front panel 332 and filter glass 333, and the video display screen section 331 includes the display apparatus 10.

REFERENCE SIGNS LIST

10: Display apparatus
11, 19: Circuit board
12R, 12G, 12UV, 15G: Compound semiconductor light emitting element
12m, 12n: Connection member
13: Color filter
13H, 13GH: Opening
13BM: Light blocking section
13G: Green filter section
14G, 16G: Color converting layer
17: Protective layer
18: Counter board
20P: Pixel
20R: Red subpixel
20G: Green subpixel
20B: Blue subpixel
21: Wavelength cut filter
21R, 21G: Wavelength cut filter section
22: Bandpass filter
30: Driving circuit
31: Image data input interface
32: Timing controller
32A: Image processing section
32B: Luminance control section
33A, 33B: Gamma correction circuit
34: Horizontal scanning driver
35: Vertical scanning driver
36: Light emitting element array
37: Image data
120R, 120G, 120B: Compound semiconductor laminate
121R, 121G, 121B: First electrode
122R, 122G, 122B: Second electrode
123R, 123G, 123B: First compound semiconductor layer
124R, 124G, 124B: Light emitting layer
125R, 125G, 125B: Second compound semiconductor layer
310: Digital still camera (electronic equipment)
320: Head mounted display (electronic equipment)
330: Television apparatus (electronic equipment)

The invention claimed is:

1. A display apparatus, comprising:
a board including a driving circuit, wherein the driving circuit is based on a current amplitude modulation scheme;
multiple first light emitting elements;
multiple second light emitting elements, wherein the multiple first light emitting elements and the multiple second light emitting elements have a two-dimensional arrangement on the board; and
a wavelength correcting layer configured to correct wavelengths of light emitted from the multiple first light emitting elements, wherein
the driving circuit is configured to independently gamma-correct a first signal fed to each first light emitting element of the multiple first light emitting elements and a second signal fed to each second light emitting element of the multiple second light emitting elements.

2. The display apparatus according to claim 1, wherein a first light emitting element of the multiple first light emitting elements is configured to cause an emission wavelength shift in response to a change in current density of the first light emitting element.

3. The display apparatus according to claim 1, wherein the driving circuit is further configured to control luminance of a first light emitting element of the multiple first light emitting elements to compensate for a reduction in luminance caused by the wavelength correcting layer.

4. The display apparatus according to claim 1, wherein the wavelength correcting layer is on or above the multiple first light emitting elements.

5. The display apparatus according to claim 1, wherein
the each first light emitting element includes a first compound semiconductor light emitting element, and
the first compound semiconductor light emitting element is configured to emit green light.

6. The display apparatus according to claim 5, wherein
the each second light emitting element includes a second compound semiconductor light emitting element and a third compound semiconductor light emitting element,
the second compound semiconductor light emitting element is configured to emit red light, and
the third compound semiconductor light emitting element is configured to emit blue light.

7. The display apparatus according to claim 1, wherein
the each first light emitting element includes one type of light emitting element or two types of light emitting elements selected from a group, and
the group includes a first compound semiconductor light emitting element configured to emit green light, a second compound semiconductor light emitting element configured to emit red light, and a third compound semiconductor light emitting element configured to emit blue light.

8. The display apparatus according to claim 7, wherein the each second light emitting element includes light emitting elements other than the one type of light emitting element or the two types of light emitting elements.

9. The display apparatus according to claim 1, wherein a first light emitting element of the multiple first light emitting elements includes a GaN-based compound semiconductor light emitting element.

10. The display apparatus according to claim 1, wherein a first peak wavelength of a first light emitting element of the multiple first light emitting elements at a first time of weak excitation is closer to a central wavelength of the wavelength correcting layer than a second peak wavelength of the first light emitting element at a second time of strong excitation.

11. The display apparatus according to claim 1, wherein the wavelength correcting layer is a color filter.

12. The display apparatus according to claim 1, wherein the wavelength correcting layer is a wavelength cut filter.

13. The display apparatus according to claim 1, wherein the wavelength correcting layer is a color converting layer.

14. The display apparatus according to claim 1, wherein the wavelength correcting layer is a bandpass filter.

15. The display apparatus according to claim 1, wherein
the wavelength correcting layer is on or above the multiple first light emitting elements and the multiple second light emitting elements, and
the wavelength correcting layer is further configured to:
   block light in a part of a wavelength range of a first light emitting element of the multiple first light emitting elements; and
   allow light in a remaining part of the wavelength range to transmit therethrough.

16. The display apparatus according to claim 1, wherein
a first light emitting element of the multiple first light emitting elements and the wavelength correcting layer constitute a first subpixel,
a second light emitting element of the multiple second light emitting elements constitutes a second subpixel, and
the first subpixel has a larger area than the second subpixel.

17. The display apparatus according to claim 1, wherein
the wavelength correcting layer includes multiple wavelength correcting sections and a light blocking section,
each wavelength correcting section of the multiple wavelength correcting sections is on or above a first light emitting element of the multiple first light emitting elements, and
the light blocking section is around or on a wavelength correcting section of the multiple wavelength correcting sections.

18. Electronic equipment, comprising:
the display apparatus according to claim 1.

19. A display apparatus, comprising:
a board including a driving circuit, wherein the driving circuit is based on a current amplitude modulation scheme;
multiple first light emitting elements; and
multiple second light emitting elements, wherein
   the multiple first light emitting elements and the multiple second light emitting elements have a two-dimensional arrangement on the board,
   each first light emitting element of the multiple first light emitting elements has a resonator structure,
   the resonator structure is configured to correct light emitted from a first light emitting element of the multiple first light emitting elements, and
   the driving circuit is configured to independently gamma-correct a first signal fed to the each first light emitting element and a second signal fed to each second light emitting element of the multiple second light emitting elements.

20. The display apparatus according to claim 19, wherein
a first light emitting element of the multiple first light emitting elements is configured to cause an emission wavelength shift in response to a change in current density of the first light emitting element, and
the resonator structure is further configured to resonate and emphasize light of a defined color included in light subjected to the wavelength shift in response to the change in the current density of the first light emitting element.

* * * * *